United States Patent
Tsutsumi et al.

(10) Patent No.: US 9,871,500 B2
(45) Date of Patent: Jan. 16, 2018

(54) MULTILAYER ELECTRONIC COMPONENT

(71) Applicant: TDK CORPORATION, Tokyo (JP)

(72) Inventors: Masanori Tsutsumi, Tokyo (JP);
Kazuhiro Tsukamoto, Tokyo (JP);
Manabu Kitami, Tokyo (JP);
Toshiyuki Takami, Tokyo (JP); Shohei Kusumoto, Tokyo (JP); Noriyuki Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 36 days.

(21) Appl. No.: 15/082,513

(22) Filed: Mar. 28, 2016

(65) Prior Publication Data

US 2016/0352303 A1 Dec. 1, 2016

(30) Foreign Application Priority Data

May 28, 2015 (JP) .................................. 2015-108584

(51) Int. Cl.
*H03H 7/42* (2006.01)
*H01P 5/10* (2006.01)

(52) U.S. Cl.
CPC ..................... *H03H 7/42* (2013.01)

(58) Field of Classification Search
CPC ..................... H03H 7/42; H01P 5/10
USPC .......................................................... 333/25
See application file for complete search history.

(56) References Cited

U.S. PATENT DOCUMENTS

| | | | | |
|---|---|---|---|---|
| 6,819,199 B2* | 11/2004 | Burns | ........................ | H01P 5/10 333/26 |
| 7,256,663 B2* | 8/2007 | Yasuda | ....................... | H01P 5/10 333/185 |
| 7,468,640 B2* | 12/2008 | Nosaka | ....................... | H01P 5/10 333/25 |
| 7,605,672 B2* | 10/2009 | Kirkeby | .................... | H01P 5/10 333/112 |
| 8,228,133 B2* | 7/2012 | Motoyama | ................ | H01P 5/10 333/238 |
| 8,964,605 B1* | 2/2015 | Ansari | ...................... | H03H 7/42 370/278 |
| 2010/0246454 A1* | 9/2010 | Ansari | ...................... | H01P 5/10 370/278 |

FOREIGN PATENT DOCUMENTS

| | | |
|---|---|---|
| JP | 2004056799 A | 2/2004 |
| JP | 2006-270444 A | 10/2006 |
| JP | 2011015082 A | 1/2011 |

\* cited by examiner

*Primary Examiner* — Dean Takaoka
(74) *Attorney, Agent, or Firm* — Oliff PLC

(57) ABSTRACT

A multilayer electronic component includes a stack and a balun. The stack includes a plurality of stacked dielectric layers and conductor layers. The balun is formed using the stack. The balun includes an unbalanced transmission line and first to fourth balanced transmission lines. The unbalanced transmission line includes a first line portion and a second line portion connected in series. The first and second balanced transmission lines are configured to be electromagnetically coupled to the first line portion. The third and fourth balanced transmission lines are configured to be electromagnetically coupled to the second line portion.

4 Claims, 18 Drawing Sheets

MULTILAYER ELECTRONIC COMPONENT

BACKGROUND OF THE INVENTION

1. Field of the Invention

The present invention relates to a multilayer electronic component including a balun.

2. Description of the Related Art

One of electronic components for use in transmission/reception circuits of wireless communication apparatuses such as cellular phones and wireless LAN communication apparatuses is a balun for converting between an unbalanced signal and a balanced signal. It is required of the balun to exhibit a good amplitude balance characteristic and a good phase balance characteristic over a wide frequency band. The good amplitude balance characteristic means that two balanced element signals that constitute a balanced signal output from the balun have an amplitude difference of approximately zero. The good phase balance characteristic means that the two balanced element signals have a phase difference of approximately 180 degrees.

Marchand baluns, such as ones disclosed in JP 2004-056799A and JP 2006-270444A, are known as wideband capable baluns.

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a balun operable in a wider band than was previously possible.

Further, it is particularly required of mobile communication apparatuses that the electronic components such as baluns for use therein be reduced in size.

JP 2004-056799A discloses a technique to achieve an increased bandwidth of a balun by connecting two Marchand baluns in parallel to form a single balun. One of the two Marchand baluns is composed of a first coupling line and a second coupling line, and the other is composed of a third coupling line and a fourth coupling line. JP 2004-056799A also discloses a technique to achieve a further increase in bandwidth of the balun by using a multiwire coupling line to form each of the first to fourth coupling lines. The multiwire coupling line is composed of at least one first line and second lines, one each second line being located on either side of each first line.

However, the balun disclosed in JP 2004-056799A has the following problems. More specifically, in the balun disclosed in JP 2004-056799A, all the first to fourth coupling lines are located on the same surface of a semiconductor substrate. The balun thus occupies a large area and is difficult to miniaturize. Further, attempting to miniaturize the balun would bring a plurality of lines that should not be coupled to each other into close proximity to each other to generate unwanted coupling between those lines, thus resulting in failure to provide desired characteristics.

OBJECT AND SUMMARY OF THE INVENTION

It is an object of the present invention to provide an electronic component that includes a balun exhibiting a good amplitude balance characteristic and a good phase balance characteristic over a wide frequency band, and that is miniaturizable.

The present invention provides a multilayer electronic component including a stack and a balun, the balun being formed using the stack. The stack includes a plurality of dielectric layers and a plurality of conductor layers stacked on each other. The balun includes an unbalanced port, a first balanced port, a second balanced port, an unbalanced transmission line, and first to fourth balanced transmission lines. The unbalanced transmission line includes a first line portion and a second line portion connected in series. The first balanced transmission line and the second balanced transmission line are configured to be electromagnetically coupled to the first line portion. The third balanced transmission line and the fourth balanced transmission line are configured to be electromagnetically coupled to the second line portion.

Each of the first and second line portions and first to fourth balanced transmission lines has a first end and a second end opposite to each other. The first end of the first line portion is connected to the unbalanced port. The second end of the first line portion is connected to the second end of the second line portion. The first end of the first balanced transmission line and the first end of the second balanced transmission line are connected to the first balanced port. The first end of the third balanced transmission line and the first end of the fourth balanced transmission line are connected to the second balanced port. Each of the first and second line portions and first to fourth balanced transmission lines is formed using at least one of the plurality of conductor layers.

In the multilayer electronic component of the present invention, the first line portion, the first balanced transmission line, and the second balanced transmission line may be at locations different from each other in the direction in which the plurality of dielectric layers are stacked, the first line portion being interposed between the first balanced transmission line and the second balanced transmission line. Similarly, the second line portion, the third balanced transmission line, and the fourth balanced transmission line may be at locations different from each other in the direction in which the plurality of dielectric layers are stacked, the second line portion being interposed between the third balanced transmission line and the fourth balanced transmission line. In this case, each of the first and second line portions and first to fourth balanced transmission lines may include a coil.

In the multilayer electronic component of the present invention, the first line portion, the first balanced transmission line, and the second balanced transmission line may be located in a first region in the stack, whereas the second line portion, the third balanced transmission line, and the fourth balanced transmission line may be located in a second region in the stack. The first region and the second region are separate from each other in the direction in which the plurality of dielectric layers are stacked.

The multilayer electronic component of the present invention may further include a branching circuit that is formed using the stack and connected to the balun. The branching circuit may include a first filter and a second filter connected to the unbalanced port. The first filter selectively passes a first signal of a frequency within a first frequency band. The second filter selectively passes a second signal of a frequency within a second frequency band higher than the first frequency band.

In the multilayer electronic component of the present invention, the balun includes the first and second balanced transmission lines configured to be electromagnetically coupled to the first line portion of the unbalanced transmission line, and also includes the third and fourth balanced transmission lines configured to be electromagnetically coupled to the second line portion of the unbalanced transmission line. This allows the balun to exhibit a good amplitude balance characteristic and a good phase balance characteristic over a wide frequency band. Further, in the present invention, the balun is formed using the stack. This allows for miniaturization of the multilayer electronic component including the balun. The present invention thus makes it possible to provide a multilayer electronic component that includes a balun exhibiting a good amplitude balance characteristic and a good phase balance characteristic over a wide frequency band, and that is miniaturizable.

Other and further objects, features and advantages of the invention will appear more fully from the following description.

DETAILED DESCRIPTION OF THE PREFERRED EMBODIMENT

Figure 3:
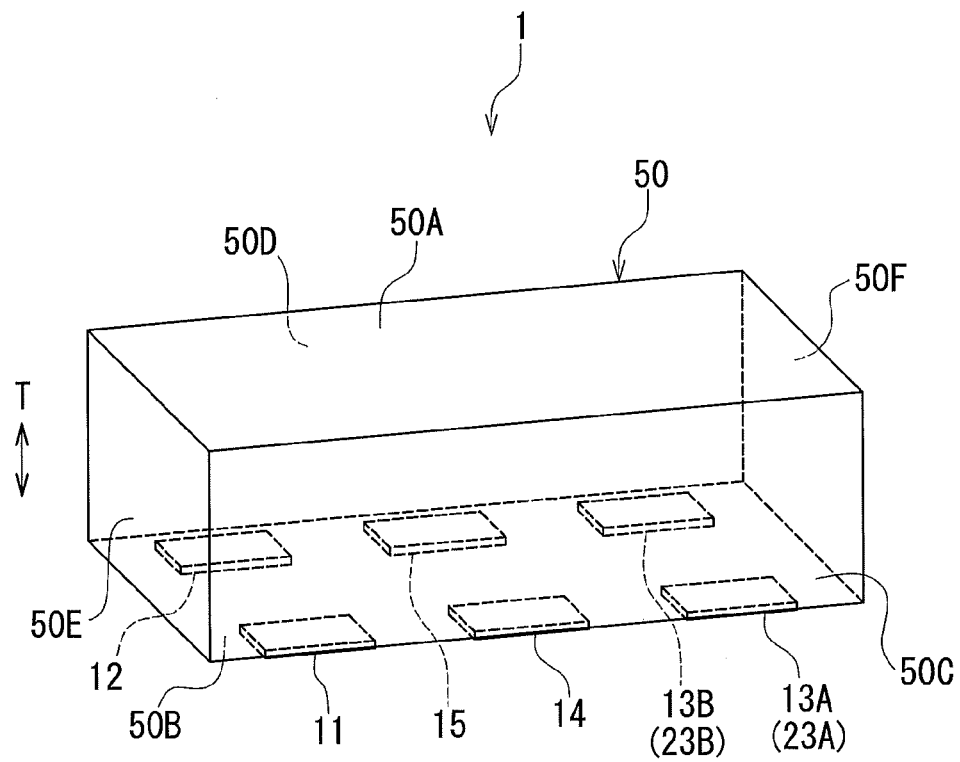
FIG. 3 is a perspective view of the multilayer electronic component according to the embodiment of the invention.

A preferred embodiment of the present invention will now be described in detail with reference to the drawings. FIG. 3 is a perspective view of a multilayer electronic component 1 according to the embodiment of the invention. As shown in FIG. 3, the multilayer electronic component 1 according to the embodiment includes a stack 50. As will be described in detail later, the stack 50 includes a plurality of dielectric layers and a plurality of conductor layers stacked on each other.

The stack 50 is shaped like a rectangular solid and has a periphery. The periphery of the stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. In the stack 50, the plurality of dielectric layers are stacked in the direction perpendicular to the top surface 50A and the bottom surface 50B. The arrow T in FIG. 3 indicates the direction in which the plurality of dielectric layers are stacked, which will hereinafter be referred to as the stacking direction.

As shown in FIG. 3, the multilayer electronic component 1 has a first signal terminal 11, a second signal terminal 12, a first balanced terminal 13A, a second balanced terminal 13B, and two ground terminals 14 and 15. The ground terminals 14 and 15 are connected to the ground. The terminals 11, 12, 13A, 13B, 14 and 15 are provided on the bottom surface 50B of the stack 50.

Figure 1:
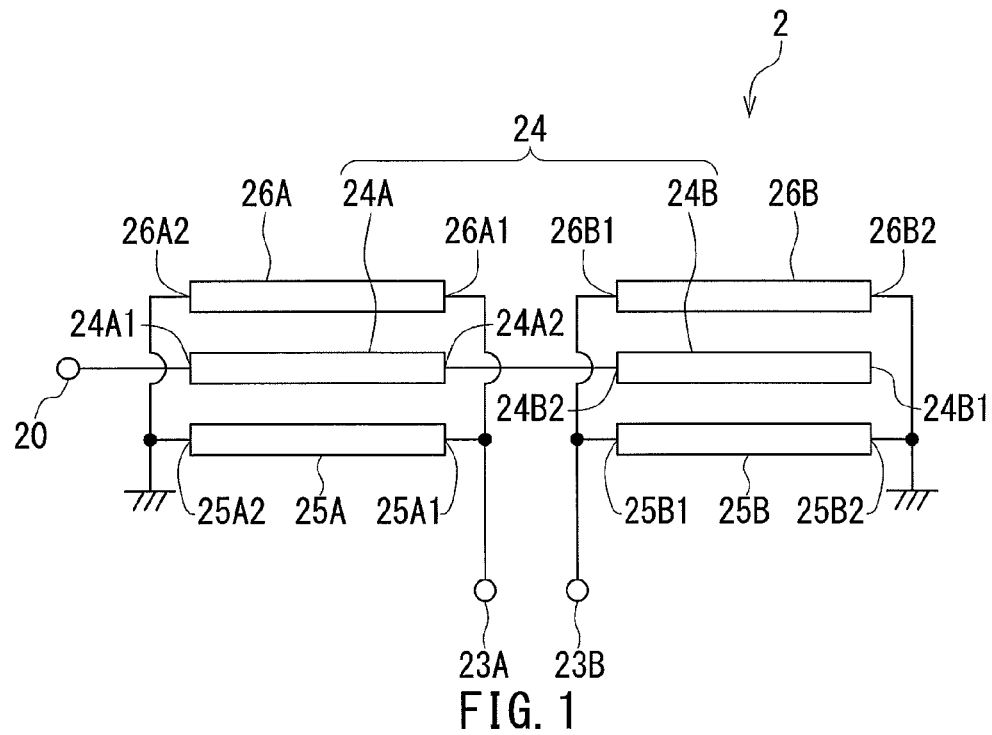
FIG. 1 is a circuit diagram illustrating the circuit configuration of a balun included in a multilayer electronic component according to an embodiment of the invention.

The multilayer electronic component 1 includes a balun 2 formed using the stack 50. FIG. 1 is a circuit diagram illustrating the circuit configuration of the balun 2. As shown in FIG. 1, the balun 2 includes an unbalanced port 20, a first balanced port 23A, a second balanced port 23B, an unbalanced transmission line 24, a first balanced transmission line 25A, a second balanced transmission line 26A, a third balanced transmission line 25B, and a fourth balanced transmission line 26B.

The unbalanced transmission line 24 includes a first line portion 24A and a second line portion 24B connected in series. The first balanced transmission line 25A and the second balanced transmission line 26A are configured to be electromagnetically coupled to the first line portion 24A. The third balanced transmission line 25B and the fourth balanced transmission line 26B are configured to be electromagnetically coupled to the second line portion 24B.

The first line portion 24A has a first end 24A1 and a second end 24A2 opposite to each other. The second line portion 24B has a first end 24B1 and a second end 24B2 opposite to each other. The first end 24A1 of the first line portion 24A is connected to the unbalanced port 20. The second end 24A2 of the first line portion 24A is connected to the second end 24B2 of the second line portion 24B.

The first balanced transmission line 25A has a first end 25A1 and a second end 25A2 opposite to each other. The second balanced transmission line 26A has a first end 26A1 and a second end 26A2 opposite to each other. The third balanced transmission line 25B has a first end 25B1 and a second end 25B2 opposite to each other. The fourth balanced transmission line 26B has a first end 26B1 and a second end 26B2 opposite to each other.

The first end 25A1 of the first balanced transmission line 25A and the first end 26A1 of the second balanced transmission line 26A are connected to the first balanced port 23A. The first end 25B1 of third balanced transmission line 25B and the first end 26B1 of the fourth balanced transmission line 26B are connected to the second balanced port 23B.

The first balanced terminal 13A shown in FIG. 3 corresponds to the first balanced port 23A. The second balanced terminal 13B shown in FIG. 3 corresponds to the second balanced port 23B. The respective second ends 25A2, 26A2, 25B2 and 26B2 of the first to fourth balanced transmission lines 25A, 26A, 25B and 26B are connected to the ground terminals 14 and 15 shown in FIG. 3.

The first and second balanced transmission lines 25A and 26A are connected in parallel. The third and fourth balanced transmission lines 25B and 26B are connected in parallel.

The balun 2 of the embodiment falls under the category of Marchand baluns. Each of the first and second line portions 24A and 24B and first to fourth balanced transmission lines 25A, 26A, 25B and 26B is a quarter-wave line having a length of a quarter of a wavelength that corresponds to a predetermined frequency within the service frequency band of the balun 2.

The respective first ends 24A1 and 24B1 of the first and second line portions 24A and 24B and the respective first ends 25A1, 26A1, 25B1 and 26B1 of the first to fourth balanced transmission lines 25A, 26A, 25B and 26B are open ends. The respective second ends 25A2, 26A2, 25B2 and 26B2 of the first to fourth balanced transmission lines 25A, 26A, 25B and 26B are short-circuited ends.

The first balanced transmission line 25A is opposed to the first line portion 24A with the first end 25A1 and the second end 25A2 located adjacent to the second end 24A2 and the first end 24A1 of the first line portion 24A, respectively. Likewise, the second balanced transmission line 26A is opposed to the first line portion 24A with the first end 26A1 and the second end 26A2 located adjacent to the second end 24A2 and the first end 24A1 of the first line portion 24A, respectively.

The third balanced transmission line 25B is opposed to the second line portion 24B with the first end 25B1 and the second end 25B2 located adjacent to the second end 24B2 and the first end 24B1 of the second line portion 24B, respectively. Likewise, the fourth balanced transmission line 26B is opposed to the second line portion 24B with the first end 26B1 and the second end 26B2 located adjacent to the second end 24B2 and the first end 24B1 of the second line portion 24B, respectively.

As will be described in detail later, each of the first and second line portions 24A and 24B and first to fourth balanced transmission lines 25A, 26A, 25B and 26B is formed using at least one of the plurality of conductor layers included in the stack 50.

Figure 2:
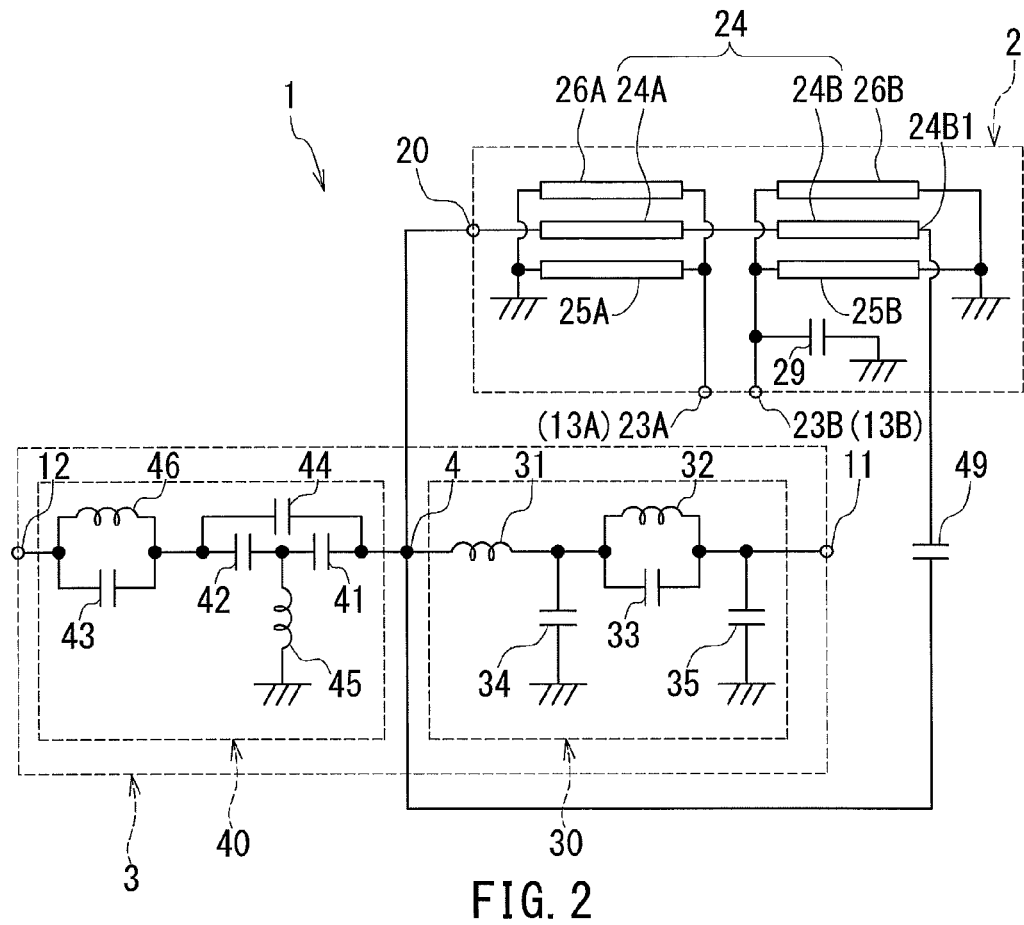
FIG. 2 is a circuit diagram illustrating the overall circuit configuration of the multilayer electronic component according to the embodiment of the invention.

FIG. 2 is a circuit diagram illustrating the overall circuit configuration of the multilayer electronic component 1. As shown in FIG. 2, the multilayer electronic component 1 includes a branching circuit 3 connected to the balun 2. The branching circuit 3 is formed using the stack 50, as is the balun 2.

The branching circuit 3 includes a first filter 30 and a second filter 40 connected to the unbalanced port 20 of the balun 2. The first filter 30 selectively passes a first signal of a frequency within a first frequency band. The second filter 40 selectively passes a second signal of a frequency within a second frequency band higher than the first frequency band. For example, both of the filters 30 and 40 are bandpass filters. FIG. 2 illustrates an example of configurations of the filters 30 and 40. The example of configurations of the filters 30 and 40 will now be described.

In FIG. 2, the reference numeral 4 represents the connection point between the first filter 30 and the second filter 40. The connection point 4 is connected to the unbalanced port 20 of the balun 2.

The first filter 30 includes inductors 31 and 32 provided in series between the connection point 4 and the first signal terminal 11. The inductor 31 is located closer to the connection point 4 than is the inductor 32. The first filter 30 further includes capacitors 33, 34 and 35. The capacitor 33 is provided in parallel with the inductor 32. The capacitor 34 is provided between the ground and the connection point between the inductors 31 and 32. The capacitor 35 is provided between the first signal terminal 11 and the ground.

The second filter 40 includes capacitors 41, 42 and 43 provided in series between the connection point 4 and the second signal terminal 12. The capacitors 41, 42 and 43 are arranged in this order when viewed from the connection point 4. The second filter 40 further includes a capacitor 44 provided between the connection point 4 and the connection point between the capacitors 42 and 43. The second filter 40 further includes inductors 45 and 46. The inductor 45 is provided between the ground and the connection point between the capacitors 41 and 42. The inductor 46 is provided in parallel with the capacitor 43.

In the example shown in FIG. 2, the multilayer electronic component 1 further includes capacitors 29 and 49. The capacitor 29 is provided between the second balanced terminal 13B (the second balanced port 23B) and the ground. The capacitor 49 is provided between the first end 24B1 of the second line portion 24B and the connection point 4.

Figure 4:
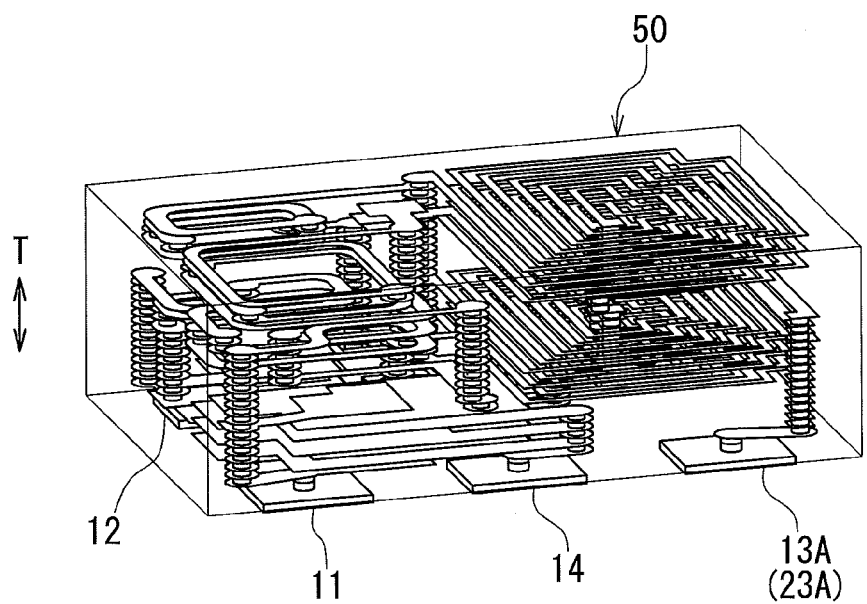
FIG. 4 is a perspective internal view of a stack included in the multilayer electronic component shown in FIG. 3.
Figure 5:
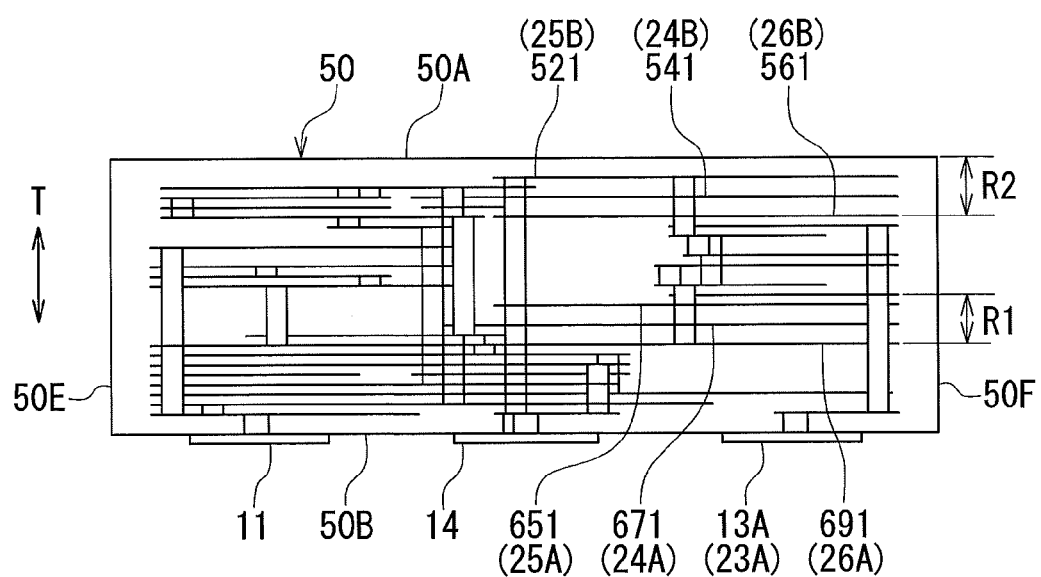
FIG. 5 is a cross-sectional view of the stack included in the multilayer electronic component shown in FIG. 3.
Figure 6A:
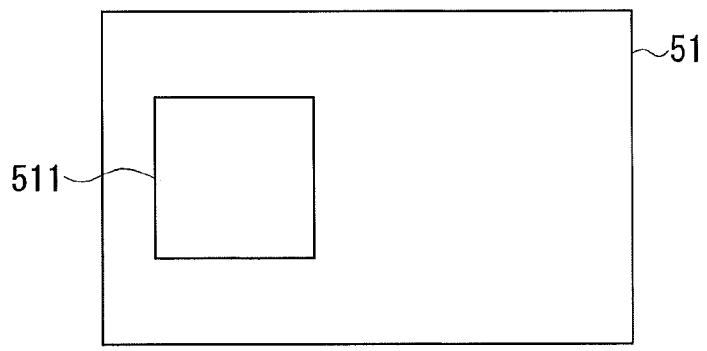
FIG. 6A to FIG. 6C are explanatory diagrams illustrating the respective top surfaces of the first to third dielectric layers of the stack included in the multilayer electronic component shown in FIG. 3.
Figure 6B:
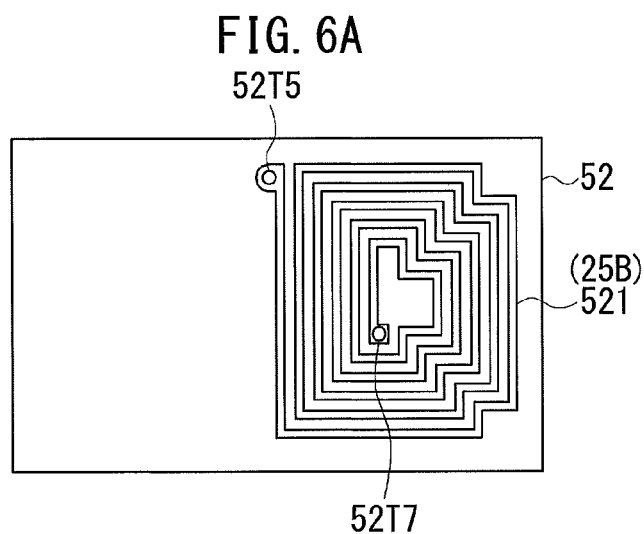
Figure 6C:
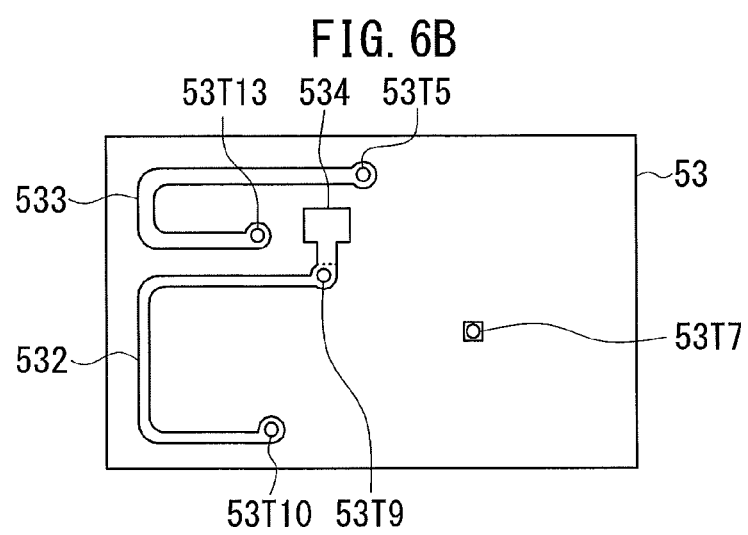
Figure 7A:
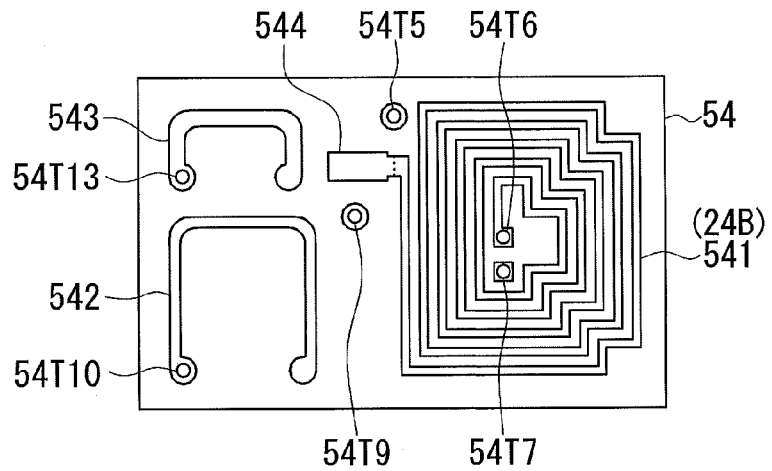
FIG. 7A to FIG. 7C are explanatory diagrams illustrating the respective top surfaces of the fourth to sixth dielectric layers of the stack included in the multilayer electronic component shown in FIG. 3.
Figure 7B:
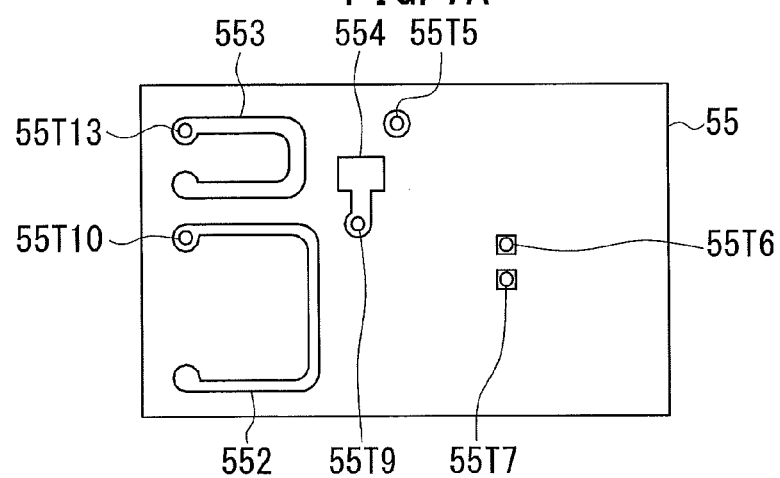
Figure 7C:
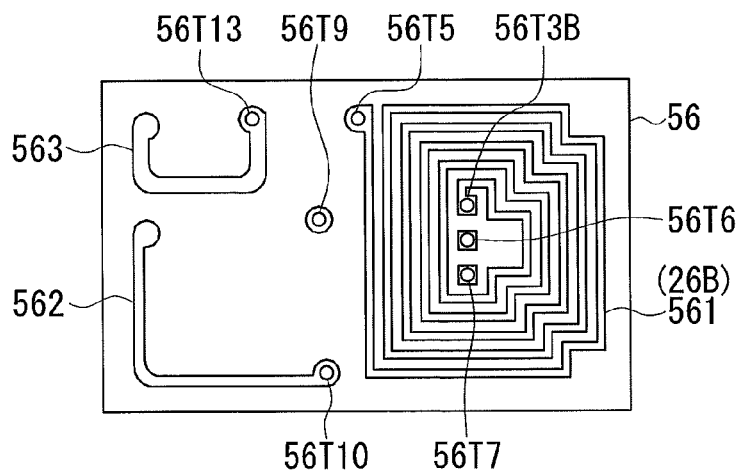
Figure 8A:
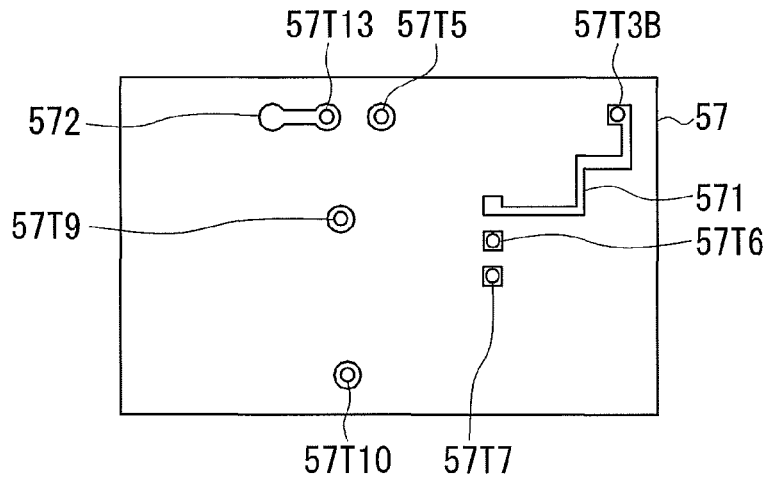
FIG. 8A to FIG. 8C are explanatory diagrams illustrating the respective top surfaces of the seventh to ninth dielectric layers of the stack included in the multilayer electronic component shown in FIG. 3.
Figure 8B:
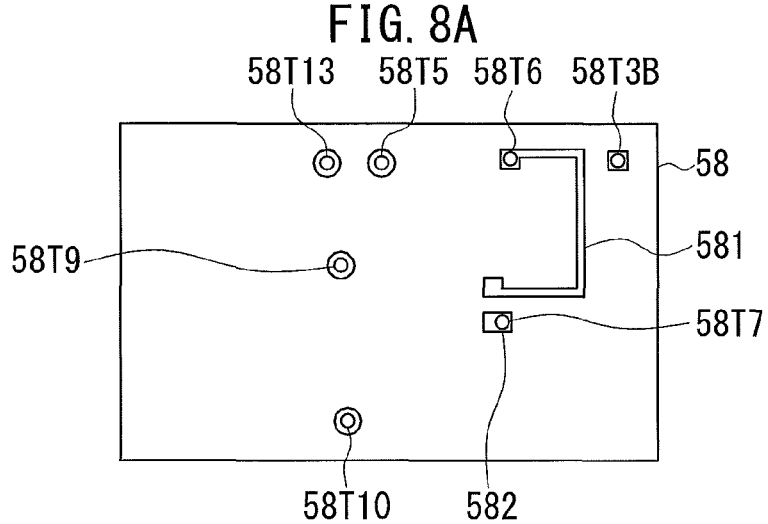
Figure 8C:
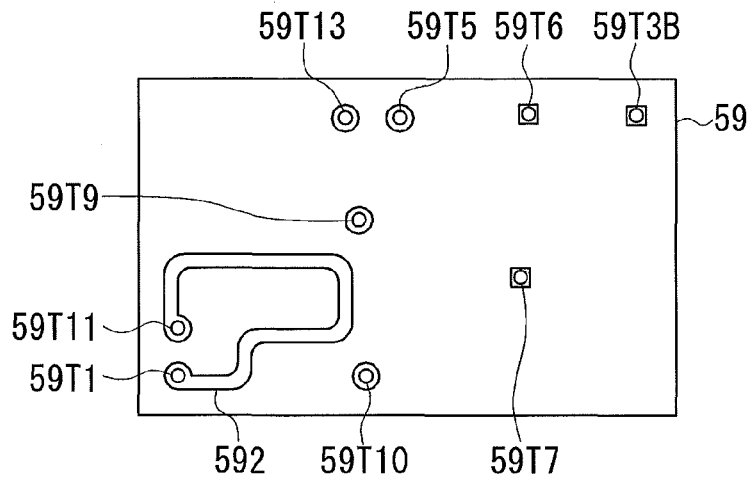
Figure 9A:
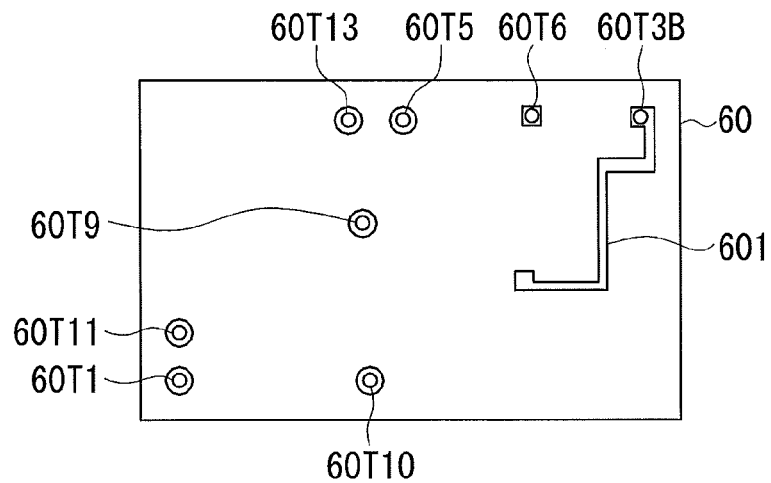
FIG. 9A to FIG. 9C are explanatory diagrams illustrating the respective top surfaces of the tenth to twelfth dielectric layers of the stack included in the multilayer electronic component shown in FIG. 3.
Figure 9B:
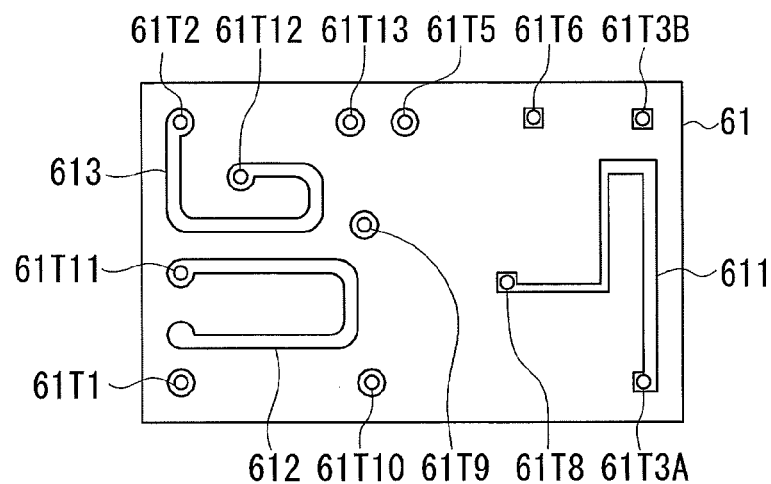
Figure 9C:
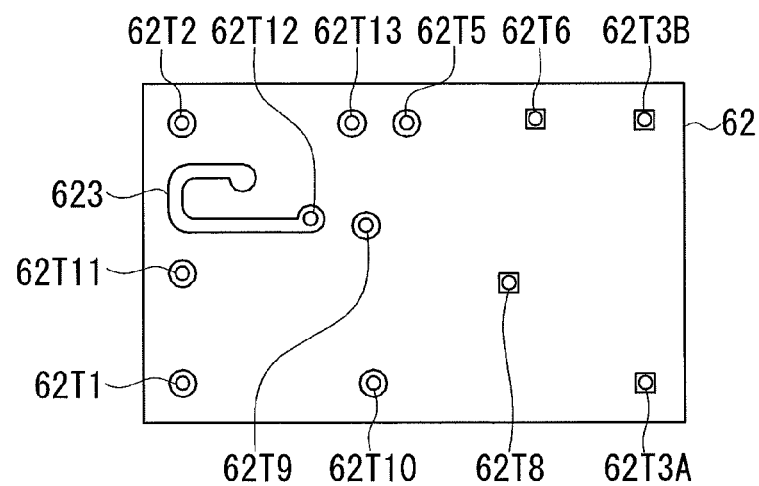
Figure 10A:
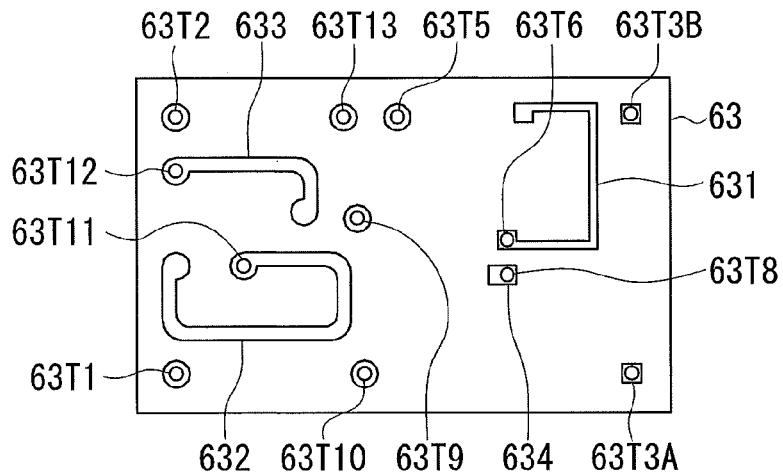
FIG. 10A to FIG. 10C are explanatory diagrams illustrating the respective top surfaces of the thirteenth to fifteenth dielectric layers of the stack included in the multilayer electronic component shown in FIG. 3.
Figure 10B:
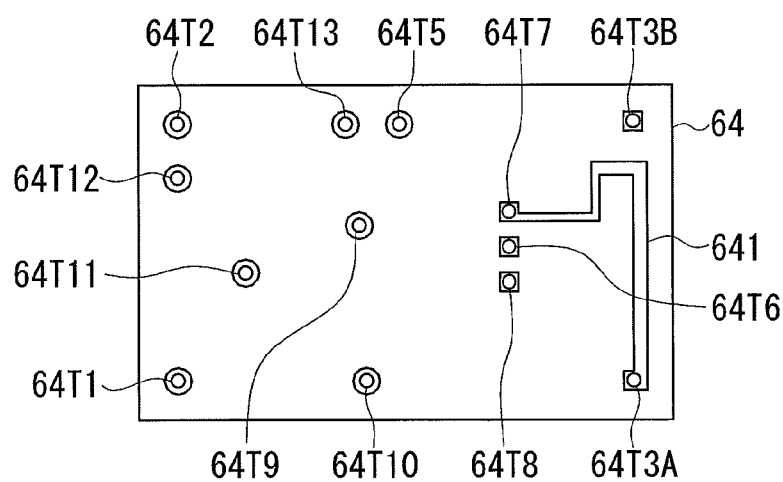
Figure 10C:
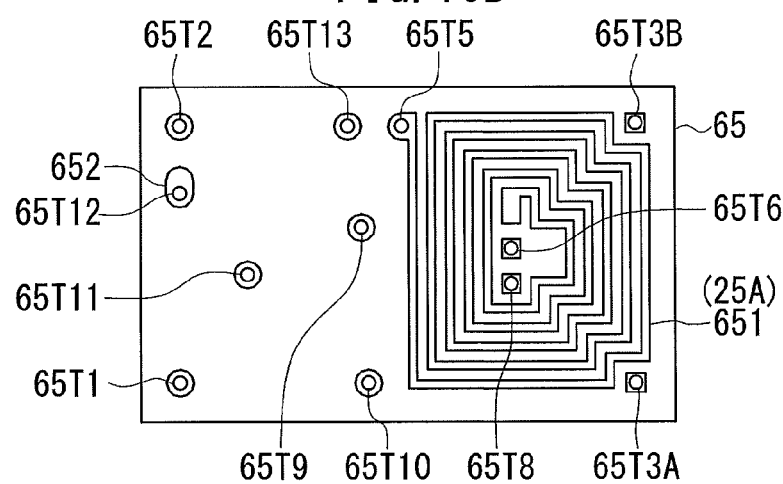
Figure 11A:
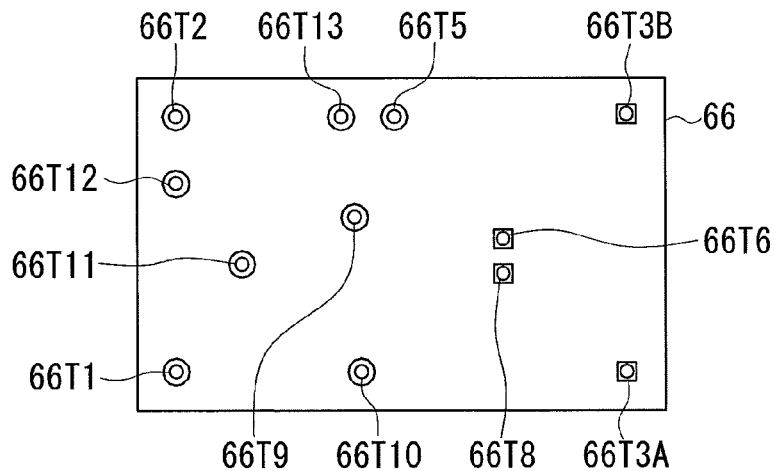
FIG. 11A to FIG. 11C are explanatory diagrams illustrating the respective top surfaces of the sixteenth to eighteenth dielectric layers of the stack included in the multilayer electronic component shown in FIG. 3.
Figure 11B:
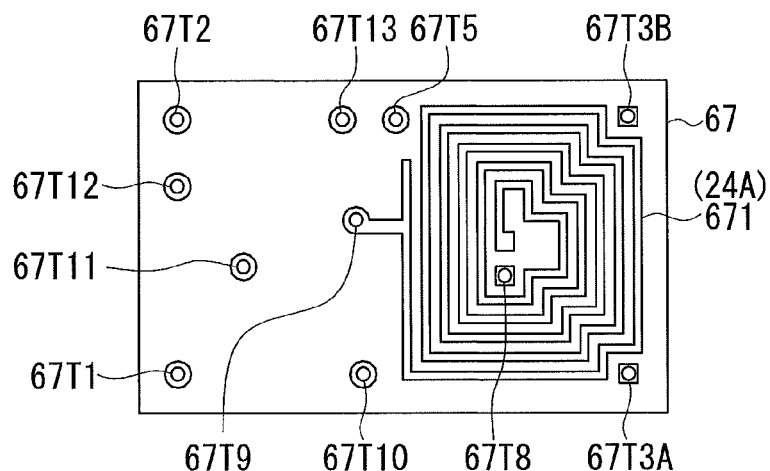
Figure 11C:
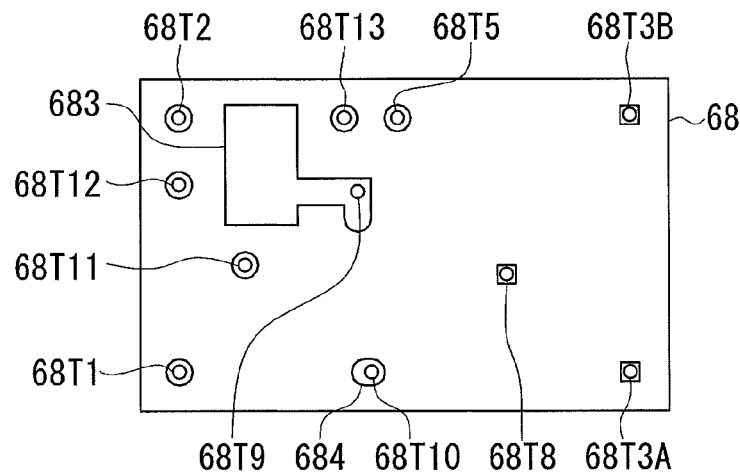
Figure 12A:
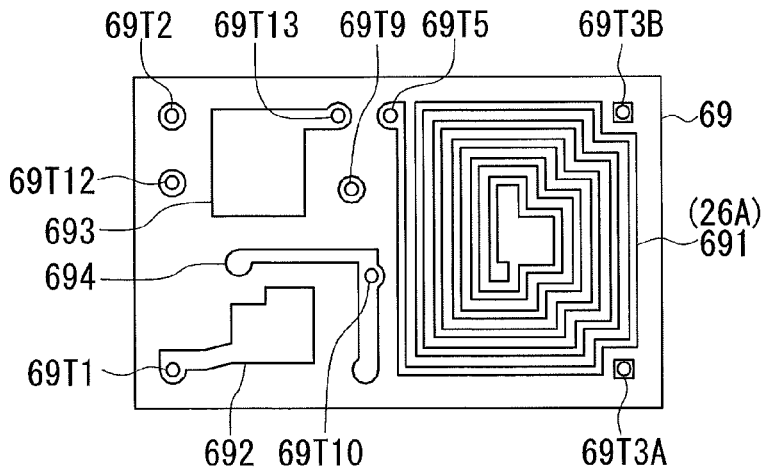
FIG. 12A to FIG. 12C are explanatory diagrams illustrating the respective top surfaces of the nineteenth to twenty-first dielectric layers of the stack included in the multilayer electronic component shown in FIG. 3.
Figure 12B:
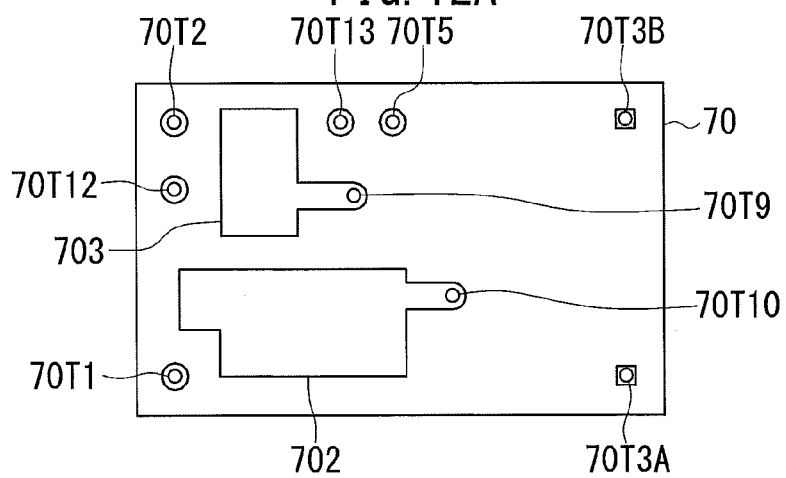
Figure 12C:
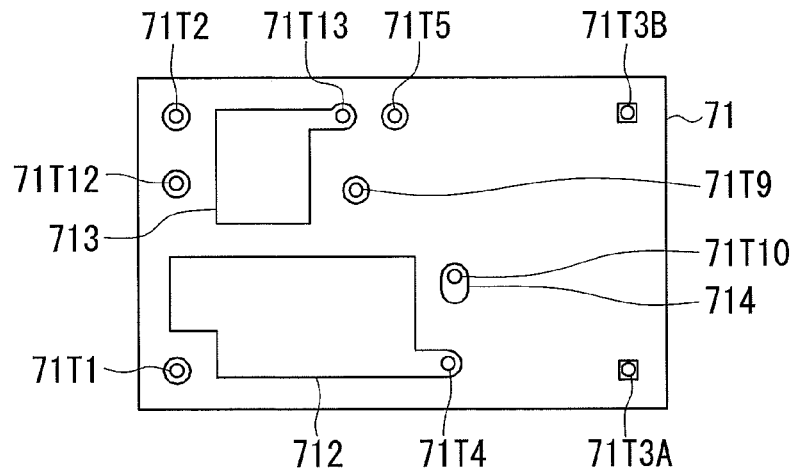
Figure 13A:
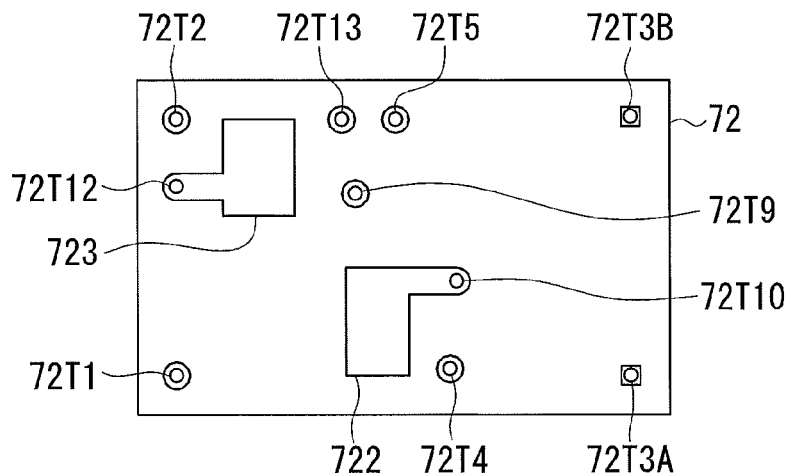
FIG. 13A to FIG. 13C are explanatory diagrams illustrating the respective top surfaces of the twenty-second to twenty-fourth dielectric layers of the stack included in the multilayer electronic component shown in FIG. 3.
Figure 13B:
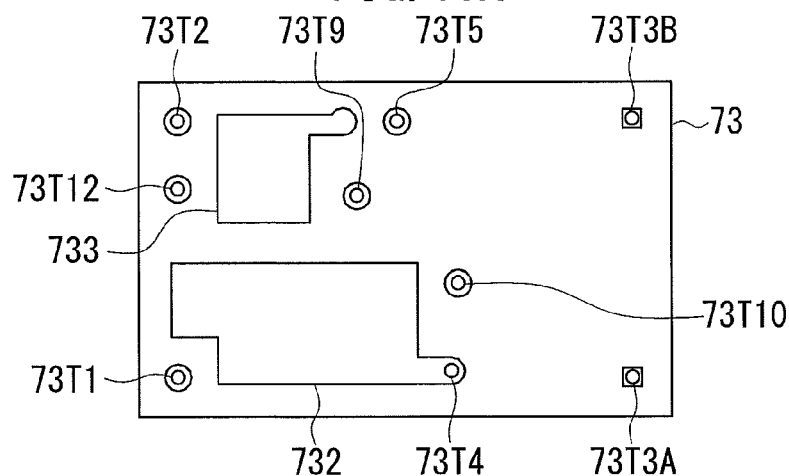
Figure 13C:
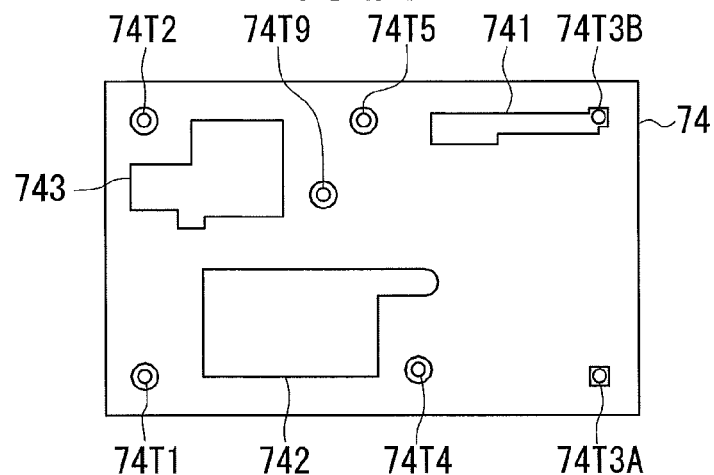
Figure 14A:
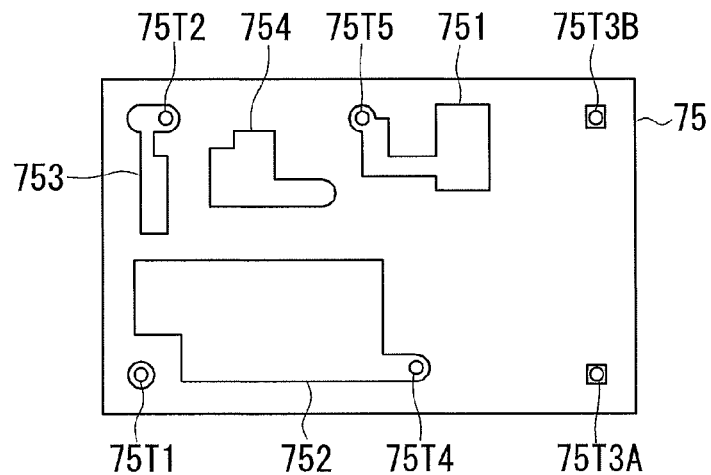
FIG. 14A to FIG. 14C are explanatory diagrams illustrating the respective top surfaces of the twenty-fifth to twenty-seventh dielectric layers of the stack included in the multilayer electronic component shown in FIG. 3.
Figure 14B:
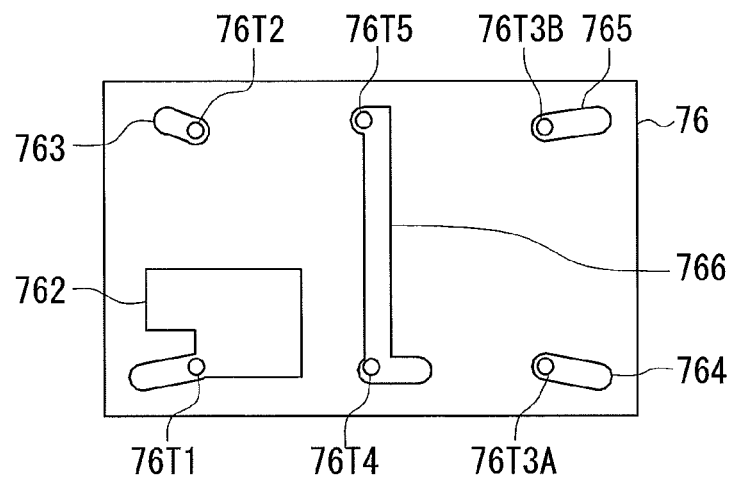
Figure 14C:
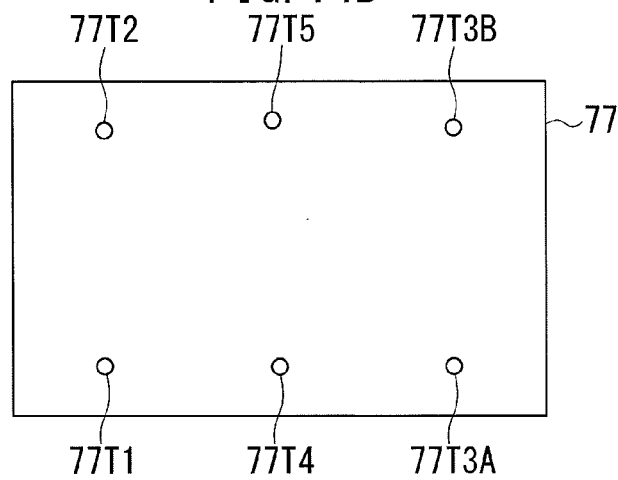
Figure 15:
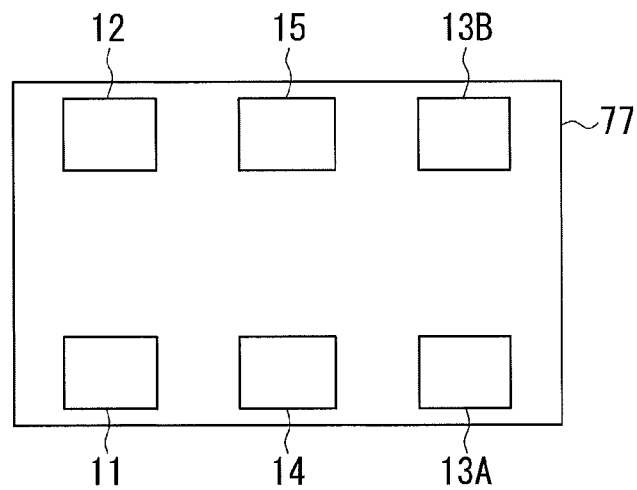
FIG. 15 is an explanatory diagram illustrating the bottom surface of the twenty-seventh dielectric layer of the stack included in the multilayer electronic component shown in FIG. 3.

The stack 50 will now be described in detail. The stack 50 includes twenty-seven dielectric layers stacked on each other. The twenty-seven dielectric layers will be referred to as the first to twenty-seventh dielectric layers in the order from top to bottom. FIG. 4 is a perspective internal view of the stack 50. FIG. 5 is a cross-sectional view of the stack 50. FIG. 6A to FIG. 6C illustrate the top surfaces of the first to third dielectric layers, respectively. FIG. 7A to FIG. 7C illustrate the top surfaces of the fourth to sixth dielectric layers, respectively. FIG. 8A to FIG. 8C illustrate the top surfaces of the seventh to ninth dielectric layers, respectively. FIG. 9A to FIG. 9C illustrate the top surfaces of the tenth to twelfth dielectric layers, respectively. FIG. 10A to FIG. 10C illustrate the top surfaces of the thirteenth to fifteenth dielectric layers, respectively. FIG. 11A to FIG. 11C illustrate the top surfaces of the sixteenth to eighteenth dielectric layers, respectively. FIG. 12A to FIG. 12C illustrate the top surfaces of the nineteenth to twenty-first dielectric layers, respectively. FIG. 13A to FIG. 13C illustrate the top surfaces of the twenty-second to twenty-fourth dielectric layers, respectively. FIG. 14A to FIG. 14C illustrate the top surfaces of the twenty-fifth to twenty-seventh dielectric layers, respectively. FIG. 15 illustrates the bottom surface of the twenty-seventh dielectric layer. In FIG. 15, the bottom surface of the twenty-seventh dielectric layer and conductor layers provided thereon can be seen from above.

As shown in FIG. 6A, a conductor layer 511 is formed on the top surface of the first dielectric layer 51. The conductor layer 511 is used as a mark. As shown in FIG. 6B, a conductor layer 521 is formed on the top surface of the second dielectric layer 52. The conductor layer 521 is used for forming the third balanced transmission line 25B. The conductor layer 521 forms a coil. The conductor layer 521 has a first end and a second end opposite to each other. Further, through holes 52T5 and 52T7 are formed in the dielectric layer 52. The through hole 52T5 is connected to a portion of the conductor layer 521 near the first end thereof. The through hole 52T7 is connected to a portion of the conductor layer 521 near the second end thereof.

As shown in FIG. 6C, conductor layers 532, 533, and 534 are formed on the top surface of the third dielectric layer 53. The conductor layers 532, 533, and 534 are used for forming the inductor 31, the inductor 45, and the capacitor 49, respectively. The conductor layers 532 and 534 are connected to each other. In FIG. 6C the boundary between the conductor layers 532 and 534 is shown by a dotted line. The conductor layer 533 has a first end and a second end opposite to each other.

Through holes 53T5, 53T7, 53T9, 53T10 and 53T13 are formed in the dielectric layer 53. The through hole 53T5 is connected to a portion of the conductor layer 533 near the first end thereof, and to the through hole 52T5 shown in FIG. 6B. The through hole 53T7 is connected to the through hole 52T7 shown in FIG. 6B. The through hole 53T9 is connected to a portion of the conductor layer 532 near the boundary with the conductor layer 534. The through hole 53T10 is connected to a portion of the conductor layer 532 near an end thereof opposite from the boundary with the conductor layer 534. The through hole 53T13 is connected to a portion of the conductor layer 533 near the second end thereof.

As shown in FIG. 7A, conductor layers 541, 542, 543, and 544 are formed on the top surface of the fourth dielectric layer 54. The conductor layers 541, 542, 543, and 544 are used for forming the second line portion 24B of the unbalanced transmission line 24, the inductor 31, the inductor 45, and the capacitor 49, respectively. The conductor layers 541 and 544 are connected to each other. In FIG. 7A the boundary between the conductor layers 541 and 544 is shown by a dotted line. The conductor layer 541 forms a coil. Each of the conductor layers 542 and 543 has a first end and a second end opposite to each other.

Through holes 54T5, 54T6, 54T7, 54T9, 54T10 and 54T13 are formed in the dielectric layer 54. The through holes 54T5, 54T7 and 54T9 are respectively connected to the through holes 53T5, 53T7 and 53T9 shown in FIG. 6C. The through hole 54T6 is connected to an end of the conductor layer 541 opposite from the boundary with the conductor layer 544. The through hole 54T10 is connected to a portion of the conductor layer 542 near the first end thereof. The through hole 54T13 is connected to a portion of the conductor layer 543 near the first end thereof. The through hole 53T10 shown in FIG. 6C is connected to a portion of the conductor layer 542 near the second end thereof. The through hole 53T13 shown in FIG. 6C is connected to a portion of the conductor layer 543 near the second end thereof.

As shown in FIG. 7B, conductor layers 552, 553, and 554 are formed on the top surface of the fifth dielectric layer 55. The conductor layers 552, 553, and 554 are used for forming the inductor 31, the inductor 45, and the capacitor 49, respectively. Each of the conductor layers 552 and 553 has a first end and a second end opposite to each other.

Through holes 55T5, 55T6, 55T7, 55T9, 55T10 and 55T13 are formed in the dielectric layer 55. The through holes 55T5, 55T6 and 55T7 are respectively connected to the through holes 54T5, 54T6 and 54T7 shown in FIG. 7A. The through hole 55T9 is connected to the conductor layer 554 and to the through hole 54T9 shown in FIG. 7A. The through hole 55T10 is connected to a portion of the conductor layer 552 near the first end thereof. The through hole 55T13 is connected to a portion of the conductor layer 553 near the first end thereof. The through hole 54T10 shown in FIG. 7A is connected to a portion of the conductor layer 552 near the second end thereof. The through hole 54T13 shown in FIG. 7A is connected to a portion of the conductor layer 553 near the second end thereof.

As shown in FIG. 7C, conductor layers 561, 562, and 563 are formed on the top surface of the sixth dielectric layer 56. The conductor layers 561, 562, and 563 are used for forming the fourth balanced transmission line 26B, the inductor 31, and the inductor 45, respectively. The conductor layer 561 forms a coil. Each of the conductor layers 561, 562 and 563 has a first end and a second end opposite to each other.

Through holes 56T3B, 56T5, 56T6, 56T7, 56T9, 56T10 and 56T13 are formed in the dielectric layer 56. The through hole 56T3B is connected to a portion of the conductor layer 561 near the first end thereof. The through hole 56T5 is connected to a portion of the conductor layer 561 near the second end thereof and to the through hole 55T5 shown in FIG. 7B. The through holes 56T6, 56T7 and 56T9 are respectively connected to the through holes 55T6, 55T7 and 55T9 shown in FIG. 7B. The through hole 56T10 is connected to a portion of the conductor layer 562 near the first end thereof. The through hole 56T13 is connected to a portion of the conductor layer 563 near the first end thereof. The through hole 55T10 shown in FIG. 7B is connected to a portion of the conductor layer 562 near the second end thereof. The through hole 55T13 shown in FIG. 7B is connected to a portion of the conductor layer 563 near the second end thereof.

As shown in FIG. 8A, conductor layers 571 and 572 are formed on the top surface of the seventh dielectric layer 57. Each of the conductor layers 571 and 572 has a first end and a second end opposite to each other. Further, through holes 57T3B, 57T5, 57T6, 57T7, 57T9, 57T10 and 57T13 are formed in the dielectric layer 57. The through hole 57T3B is connected to a portion of the conductor layer 571 near the first end thereof. The through holes 57T5, 57T6, 57T7, 57T9 and 57T10 are respectively connected to the through holes 56T5, 56T6, 56T7, 56T9 and 56T10 shown in FIG. 7C. The through hole 57T13 is connected to a portion of the conductor layer 572 near the first end thereof. The through hole 56T3B shown in FIG. 7C is connected to a portion of the conductor layer 571 near the second end thereof. The through hole 56T13 shown in FIG. 7C is connected to a portion of the conductor layer 572 near the second end thereof.

As shown in FIG. 8B, conductor layers 581 and 582 are formed on the top surface of the eighth dielectric layer 58. The conductor layer 581 has a first end and a second end opposite to each other. Further, through holes 58T3B, 58T5, 58T6, 58T7, 58T9, 58T10 and 58T13 are formed in the dielectric layer 58. The through holes 58T3B, 58T5, 58T9, 58T10 and 58T13 are respectively connected to the through holes 57T3B, 57T5, 57T9, 57T10 and 57T13 shown in FIG. 8A. The through hole 58T6 is connected to a portion of the conductor layer 581 near the first end thereof. The through hole 58T7 is connected to the conductor layer 582. The through hole 57T6 shown in FIG. 8A is connected to a portion of the conductor layer 581 near the second end thereof. The through hole 57T7 shown in FIG. 8A is connected to the conductor layer 582.

As shown in FIG. 8C, a conductor layer 592 is formed on the top surface of the ninth dielectric layer 59. The conductor layer 592 is used for forming the inductor 32, and has a first end and a second end opposite to each other. Further, through holes 59T1, 59T3B, 59T5, 59T6, 59T7, 59T9, 59T10, 59T11 and 59T13 are formed in the dielectric layer 59. The through hole 59T1 is connected to a portion of the conductor layer 592 near the first end thereof. The through holes 59T3B, 59T5, 59T6, 59T7, 59T9, 59T10 and 59T13 are respectively connected to the through holes 58T3B, 58T5, 58T6, 58T7, 58T9, 58T10 and 58T13 shown in FIG. 8B. The through hole 59T11 is connected to a portion of the conductor layer 592 near the second end thereof.

As shown in FIG. 9A, a conductor layer 601 is formed on the top surface of the tenth dielectric layer 60. The conductor layer 601 has a first end and a second end opposite to each other. Further, through holes 60T1, 60T3B, 60T5, 60T6, 60T9, 60T10, 60T11 and 60T13 are formed in the dielectric layer 60. The through holes 60T1, 60T5, 60T6, 60T9, 60T10, 60T11 and 60T13 are respectively connected to the through holes 59T1, 59T5, 59T6, 59T9, 59T10, 59T11 and 59T13 shown in FIG. 8C. The through hole 60T3B is connected to a portion of the conductor layer 601 near the first end thereof and to the through hole 59T3B shown in FIG. 8C. The through hole 59T7 shown in FIG. 8C is connected to a portion of the conductor layer 601 near the second end thereof.

As shown in FIG. 9B, conductor layers 611, 612 and 613 are formed on the top surface of the eleventh dielectric layer 61. The conductor layers 612 and 613 are used for forming the inductor 32 and the inductor 46, respectively. Each of the conductor layers 611, 612 and 613 has a first end and a second end opposite to each other. Further, through holes 61T1, 61T2, 61T3A, 61T3B, 61T5, 61T6, 61T8, 61T9, 61T10, 61T11, 61T12 and 61T13 are formed in the dielectric layer 61. The through holes 61T1, 61T3B, 61T5, 61T6, 61T9, 61T10 and 61T13 are respectively connected to the through holes 60T1, 60T3B, 60T5, 60T6, 60T9, 60T10 and 60T13 shown in FIG. 9A. The through hole 61T2 is connected to a portion of the conductor layer 613 near the first end thereof. The through hole 61T3A is connected to a portion of the conductor layer 611 near the first end thereof. The through hole 61 T8 is connected to a portion of the conductor layer 611 near the second end thereof. The through hole 61T11 is connected to a portion of the conductor layer 612 near the first end thereof. The through hole 61T12 is connected to a portion of the conductor layer 613 near the second end thereof. The through hole 60T11 shown in FIG. 9A is connected to a portion of the conductor layer 612 near the second end thereof.

As shown in FIG. 9C, a conductor layer 623 is formed on the top surface of the twelfth dielectric layer 62. The conductor layer 623 is used for forming the inductor 46, and has a first end and a second end opposite to each other. Further, through holes 62T1, 62T2, 62T3A, 62T3B, 62T5, 62T6, 62T8, 62T9, 62T10, 62T11, 62T12 and 62T13 are formed in the dielectric layer 62. The through holes 62T1, 62T2, 62T3A, 62T3B, 62T5, 62T6, 62T8, 62T9, 62T10, 62T11 and 62T13 are respectively connected to the through holes 61T1, 61T2, 61T3A, 61T3B, 61T5, 61T6, 61T8, 61T9, 61T10, 61T11 and 61T13 shown in FIG. 9B. The through hole 62T12 is connected to a portion of the conductor layer 623 near the first end thereof. The through hole 61T12 shown in FIG. 9B is connected to a portion of the conductor layer 623 near the second end thereof.

As shown in FIG. 10A, conductor layers 631, 632, 633 and 634 are formed on the top surface of the thirteenth dielectric layer 63. The conductor layers 632 and 633 are used for forming the inductor 32 and the inductor 46, respectively. Each of the conductor layers 631, 632 and 633 has a first end and a second end opposite to each other. Further, through holes 63T1, 63T2, 63T3A, 63T3B, 63T5, 63T6, 63T8, 63T9, 63T10, 63T11, 63T12 and 63T13 are formed in the dielectric layer 63. The through holes 63T1, 63T2, 63T3A, 63T3B, 63T5, 63T9, 63T10 and 63T13 are respectively connected to the through holes 62T1, 62T2, 62T3A, 62T3B, 62T5, 62T9, 62T10 and 62T13 shown in FIG. 9C. The through hole 63T6 is connected to a portion of the conductor layer 631 near the first end thereof. The through hole 63T8 is connected to the conductor layer 634. The through hole 63T11 is connected to a portion of the conductor layer 632 near the first end thereof. The through hole 63T12 is connected to a portion of the conductor layer 633 near the first end thereof. The through hole 62T6 shown in FIG. 9C is connected to a portion of the conductor layer 631 near the second end thereof. The through hole 62T8 shown in FIG. 9C is connected to the conductor layer 634. The through hole 62T11 shown in FIG. 9C is connected to a portion of the conductor layer 632 near the second end thereof. The through hole 62T12 shown in FIG. 9C is connected to a portion of the conductor layer 633 near the second end thereof.

As shown in FIG. 10B, a conductor layer 641 is formed on the top surface of the fourteenth dielectric layer 64. The conductor layer 641 has a first end and a second end opposite to each other. Further, through holes 64T1, 64T2, 64T3A, 64T3B, 64T5, 64T6, 64T7, 64T8, 64T9, 64T10, 64T11, 64T12 and 64T13 are formed in the dielectric layer 64. The through holes 64T1, 64T2, 64T3B, 64T5, 64T6, 64T8, 64T9, 64T10, 64T11, 64T12 and 64T13 are respectively connected to the through holes 63T1, 63T2, 63T3B, 63T5, 63T6, 63T8, 63T9, 63T10, 63T11, 63T12 and 63T13 shown in FIG. 10A. The through hole 64T3A is connected to a portion of the conductor layer 641 near the first end thereof and to the through hole 63T3A shown in FIG. 10A. The through hole 64T7 is connected to a portion of the conductor layer 641 near the second end thereof.

As shown in FIG. 10C, conductor layers 651 and 652 are formed on the top surface of the fifteenth dielectric layer 65. The conductor layer 651 is used for forming the first balanced transmission line 25A. The conductor layer 651 forms a coil. The conductor layer 651 has a first end and a second end opposite to each other. Further, through holes 65T1, 65T2, 65T3A, 65T3B, 65T5, 65T6, 65T8, 65T9, 65T10, 65T11, 65T12 and 65T13 are formed in the dielectric layer 65. The through holes 65T1, 65T2, 65T3A, 65T3B, 65T6, 65T8, 65T9, 65T10, 65T11 and 65T13 are respectively connected to the through holes 64T1, 64T2, 64T3A, 64T3B, 64T6, 64T8, 64T9, 64T10, 64T11 and 64T13 shown in FIG. 10B. The through hole 65T5 is connected to a portion of the conductor layer 651 near the first end thereof and to the through hole 64T5 shown in FIG. 10B. The through hole 65T12 is connected to the conductor layer 652. The through hole 64T7 shown in FIG. 10B is connected to a portion of the conductor layer 651 near the second end thereof. The through hole 64T12 shown in FIG. 10B is connected to the conductor layer 652.

As shown in FIG. 11A, through holes 66T1, 66T2, 66T3A, 66T3B, 66T5, 66T6, 66T8, 66T9, 66T10, 66T11, 66T12 and 66T13 are formed in the sixteenth dielectric layer 66. The through holes 66T1, 66T2, 66T3A, 66T3B, 66T5, 66T6, 66T8, 66T9, 66T10, 66T11, 66T12 and 66T13 are respectively connected to the through holes 65T1, 65T2, 65T3A, 65T3B, 65T5, 65T6, 65T8, 65T9, 65T10, 65T11, 65T12 and 65T13 shown in FIG. 10C.

As shown in FIG. 11B, a conductor layer 671 is formed on the top surface of the seventeenth dielectric layer 67. The conductor layer 671 is used for forming the first line portion 24A of the unbalanced transmission line 24. The conductor layer 671 includes a main part and a branch part. The main part forms a coil. The branch part is connected to the main part. The main part has a first end and a second end opposite to each other. The branch part is connected to a portion of the main part near the first end thereof.

Further, through holes 67T1, 67T2, 67T3A, 67T3B, 67T5, 67T8, 67T9, 67T10, 67T11, 67T12 and 67T13 are formed in the dielectric layer 67. The through holes 67T1, 67T2, 67T3A, 67T3B, 67T5, 67T8, 67T10, 67T11, 67T12 and 67T13 are respectively connected to the through holes 66T1, 66T2, 66T3A, 66T3B, 66T5, 66T8, 66T10, 66T11, 66T12 and 66T13 shown in FIG. 11A. The through hole 67T9 is connected to the branch part of the conductor layer 671 and to the through hole 66T9 shown in FIG. 11A. The through hole 66T6 shown in FIG. 11A is connected to a portion of the main part of the conductor layer 671 near the second end thereof.

As shown in FIG. 11C, conductor layers 683 and 684 are formed on the top surface of the eighteenth dielectric layer 68. The conductor layer 683 is used for forming the capacitor 41. Further, through holes 68T1, 68T2, 68T3A, 68T3B, 68T5, 68T8, 68T9, 68T10, 68T11, 68T12 and 68T13 are formed in the dielectric layer 68. The through holes 68T1, 68T2, 68T3A, 68T3B, 68T5, 68T8, 68T11, 68T12 and 68T13 are respectively connected to the through holes 67T1, 67T2, 67T3A, 67T3B, 67T5, 67T8, 67T11, 67T12 and 67T13 shown in FIG. 11B. The through holes 68T9 and 68T10 are connected to the conductor layers 683 and 684, respectively. The through holes 67T9 and 67T10 shown in FIG. 11B are connected to the conductor layers 683 and 684, respectively.

As shown in FIG. 12A, conductor layers 691, 692, 693 and 694 are formed on the top surface of the nineteenth dielectric layer 69. The conductor layers 691, 692, and 693 are used for forming the second balanced transmission line 26A, the capacitor 33, and the capacitor 41, respectively. The conductor layer 691 forms a coil. Each of the conductor layers 691 and 694 has a first end and a second end opposite to each other.

Further, through holes 69T1, 69T2, 69T3A, 69T3B, 69T5, 69T9, 69T10, 69T12 and 69T13 are formed in the dielectric layer 69. The through hole 69T1 is connected to the conductor layer 692 and to the through hole 68T1 shown in FIG. 11C. The through holes 69T2, 69T3A, 69T3B, 69T9 and 69T12 are respectively connected to the through holes 68T2, 68T3A, 68T3B, 68T9 and 68T12 shown in FIG. 11C. The through hole 69T5 is connected to a portion of the conductor layer 691 near the first end thereof and to the through hole 68T5 shown in FIG. 11C. The through hole 69T10 is connected to a portion of the conductor layer 694 near the midpoint position between the first and second ends thereof. The through hole 69T13 is connected to the conductor layer 693 and to the through hole 68T13 shown in FIG. 11C. The through hole 68T8 shown in FIG. 11C is connected to a portion of the conductor layer 691 near the second end thereof. The through hole 68T10 shown in FIG. 11C is connected to a portion of the conductor layer 694 near the first end thereof. The through hole 68T11 shown in FIG. 11C is connected to a portion of the conductor layer 694 near the second end thereof.

As shown in FIG. 12B, conductor layers 702 and 703 are formed on the top surface of the twentieth dielectric layer 70. The conductor layer 702 is used for forming the capacitors 33 and 34. The conductor layer 703 is used for forming the capacitor 41. Further, through holes 70T1, 70T2, 70T3A, 70T3B, 70T5, 70T9, 70T10, 70T12 and 70T13 are formed in the dielectric layer 70. The through holes 70T1, 70T2, 70T3A, 70T3B, 70T5, 70T12 and 70T13 are respectively connected to the through holes 69T1, 69T2, 69T3A, 69T3B, 69T5, 69T12 and 69T13 shown in FIG. 12A. The through hole 70T9 is connected to the conductor layer 703 and to the through hole 69T9 shown in FIG. 12A. The through hole 70T10 is connected to the conductor layer 702. The through hole 69T10 shown in FIG. 12A is connected to the conductor layer 702.

As shown in FIG. 12C, conductor layers 712, 713, and 714 are formed on the top surface of the twenty-first dielectric layer 71. The conductor layer 712 is used for forming the capacitor 34. The conductor layer 713 is used for forming the capacitors 41 and 42. Further, through holes 71T1, 71T2, 71T3A, 71T3B, 71T4, 71T5, 71T9, 71T10, 71T12 and 71T13 are formed in the dielectric layer 71. The through holes 71T1, 71T2, 71T3A, 71T3B, 71T5, 71T9 and 71T12 are respectively connected to the through holes 70T1, 70T2, 70T3A, 70T3B, 70T5, 70T9 and 70T12 shown in FIG. 12B. The through hole 71T4 is connected to the conductor layer 712. The through hole 71T10 is connected to the conductor layer 714. The through hole 71T13 is connected to the conductor layer 713 and to the through hole 70T13 shown in FIG. 12B. The through hole 70T10 shown in FIG. 12B is connected to the conductor layer 714.

As shown in FIG. 13A, conductor layers 722 and 723 are formed on the top surface of the twenty-second dielectric layer 72. The conductor layers 722 and 723 are used for forming the capacitors 34 and 42, respectively. Further, through holes 72T1, 72T2, 72T3A, 72T3B, 72T4, 72T5, 72T9, 72T10, 72T12 and 72T13 are formed in the dielectric layer 72. The through holes 72T1, 72T2, 72T3A, 72T3B, 72T4, 72T5, 72T9 and 72T13 are respectively connected to the through holes 71T1, 71T2, 71T3A, 71T3B, 71T4, 71T5, 71T9 and 71T13 shown in FIG. 12C. The through hole 72T10 is connected to the conductor layer 722 and to the through hole 71T10 shown in FIG. 12C. The through hole 72T12 is connected to the conductor layer 723 and to the through hole 71T12 shown in FIG. 12C.

As shown in FIG. 13B, conductor layers 732 and 733 are formed on the top surface of the twenty-third dielectric layer 73. The conductor layers 732 and 733 are used for forming the capacitors 34 and 42, respectively. Further, through holes 73T1, 73T2, 73T3A, 73T3B, 73T4, 73T5, 73T9, 73T10 and 72T12 are formed in the dielectric layer 73. The through holes 73T1, 73T2, 73T3A, 73T3B, 73T5, 73T9, 73T10 and 73T12 are respectively connected to the through holes 72T1, 72T2, 72T3A, 72T3B, 72T5, 72T9, 72T10 and 72T12 shown in FIG. 13A. The through hole 73T4 is connected to the conductor layer 732 and to the through hole 72T4 shown in FIG. 13A. The through hole 72T13 shown in FIG. 13A is connected to the conductor layer 733.

As shown in FIG. 13C, conductor layers 741, 742, and 743 are formed on the top surface of the twenty-fourth dielectric layer 74. The conductor layers 741 and 742 are used for forming the capacitors 29 and 34, respectively. The conductor layer 743 is used for forming the capacitors 42, 43 and 44. Further, through holes 74T1, 74T2, 74T3A, 74T3B, 74T4, 74T5 and 74T9 are formed in the dielectric layer 74. The through holes 74T1, 74T2, 74T3A, 74T4, 74T5 and 74T9 are respectively connected to the through holes 73T1, 73T2, 73T3A, 73T4, 73T5 and 73T9 shown in FIG. 13B. The through hole 74T3B is connected to the conductor layer 741 and to the through hole 73T3B shown in FIG. 13B. The through holes 73T10 and 73T12 shown in FIG. 13B are connected to the conductor layers 742 and 743, respectively.

As shown in FIG. 14A, conductor layers 751, 752, 753, and 754 are formed on the top surface of the twenty-fifth dielectric layer 75. The conductor layers 751, 753, and 754 are used for forming the capacitors 29, 43, and 44, respectively. The conductor layer 752 is used for forming the capacitors 34 and 35. Further, through holes 75T1, 75T2, 75T3A, 75T3B, 75T4 and 74T5 are formed in the dielectric layer 75. The through holes 75T1, 75T3A and 75T3B are respectively connected to the through holes 74T1, 74T3A and 74T3B shown in FIG. 13C. The through hole 75T2 is connected to the conductor layer 753. The through hole 75T4 is connected to the conductor layer 752 and to the through hole 74T4 shown in FIG. 13C. The through hole 75T5 is connected to the conductor layer 751 and to the through hole 74T5 shown in FIG. 13C. The through holes 74T2 and 74T9 shown in FIG. 13C are connected to the conductor layers 753 and 754, respectively.

As shown in FIG. 14B, conductor layers 762, 763, 764, 765 and 766 are formed on the top surface of the twenty-sixth dielectric layer 76. The conductor layer 762 is used for forming the capacitor 35. The conductor layer 766 has a first end and a second end opposite to each other. Further, through holes 76T1, 76T2, 76T3A, 76T3B, 76T4 and 76T5 are formed in the dielectric layer 76. The through holes 76T1, 76T2, 75T3A and 75T3B are connected to the conductor layers 762, 763, 764 and 765, respectively. The through hole 76T4 is connected to a portion of the conductor layer 766 near the first end thereof. The through hole 76T5 is connected to a portion of the conductor layer 766 near the second end thereof and to the through hole 75T5 shown in FIG. 14A. The through holes 75T1, 75T2, 75T3A and 75T3B shown in FIG. 14A are connected to the conductor layers 762, 763, 764 and 765, respectively. The through hole 75T4 shown in FIG. 14A is connected to a portion of the conductor layer 766 near the first end thereof.

As shown in FIG. 14C, through holes 77T1, 77T2, 77T3A, 77T3B, 77T4 and 77T5 are formed in the twenty-seventh dielectric layer 77. The through holes 77T1, 77T2, 77T3A, 77T3B, 77T4 and 77T5 are respectively connected to the through holes 76T1, 76T2, 76T3A, 76T3B, 76T4 and 76T5 shown in FIG. 14B.

The first signal terminal 11, the second signal terminal 12, the first balanced terminal 13A, the second balanced terminal 13B, and the two ground terminals 14 and 15 are formed on the bottom surface of the twenty-seventh dielectric layer 77 shown in FIG. 15, that is, the bottom surface 50B of the stack 50. The through holes 77T1, 77T2, 77T3A, 77T3B, 77T4, and 77T5 shown in FIG. 14C are connected to the terminals 11, 12, 13A, 13B, 14, and 15, respectively.

The stack 50 shown in FIG. 3 is formed by stacking the first to twenty-seventh dielectric layers 51 to 77. Then, the terminals 11, 12, 13A, 13B, 14 and 15 are formed on the bottom surface 50B of the stack 50 to complete the multilayer electronic component 1 shown in FIG. 3. FIG. 3 omits the illustration of the conductor layer 511.

Various materials such as resin, ceramic, and resin-ceramic composite materials can be used to form the dielectric layers 51 to 77. In particular, for better high frequency response, the stack 50 is preferably such one that the dielectric layers 51 to 77 are formed of ceramic, using a low-temperature co-firing method.

FIG. 4 shows the interior of the stack 50. FIG. 5 shows a cross section of the stack 50 as viewed from the side surface 50C.

Correspondences of the circuit components of the multilayer electronic component 1 shown in FIG. 2 with the components inside the stack 50 shown in FIG. 6A to FIG. 14C will now be described. The first line portion 24A of the unbalanced transmission line 24 is formed by the conductor layer 671 shown in FIG. 11B. The first balanced transmission line 25A is formed by the conductor layer 651 shown in FIG. 10C. The second balanced transmission line 26A is formed by the conductor layer 691 shown in FIG. 12A. The first line portion 24A (the conductor layer 671), the first balanced transmission line 25A (the conductor layer 651), and the second balanced transmission line 26A (the conductor layer 691) are at locations different from each other in the stacking direction T. The first line portion 24A (the conductor layer 671) is interposed between the first balanced transmission line 25A (the conductor layer 651) and the second balanced transmission line 26A (the conductor layer 691). The first balanced transmission line 25A (the conductor layer 651) is opposed to the first line portion 24A (the conductor layer 671) with the dielectric layers 65 and 66 interposed therebetween. The second balanced transmission line 26A (the conductor layer 691) is opposed to the first line portion 24A (the conductor layer 671) with the dielectric layers 67 and 68 interposed therebetween.

The second line portion 24B of the unbalanced transmission line 24 is formed by the conductor layer 541 shown in FIG. 7A. The third balanced transmission line 25B is formed by the conductor layer 521 shown in FIG. 6B. The fourth balanced transmission line 26B is formed by the conductor layer 561 shown in FIG. 7C. The second line portion 24B (the conductor layer 541), the third balanced transmission line 25B (the conductor layer 521), and the fourth balanced transmission line 26B (the conductor layer 561) are at locations different from each other in the stacking direction T. The second line portion 24B (the conductor layer 541) is interposed between the third balanced transmission line 25B (the conductor layer 521) and the fourth balanced transmission line 26B (the conductor layer 561). The third balanced transmission line 25B (the conductor layer 521) is opposed to the second line portion 24B (the conductor layer 541) with the dielectric layers 52 and 53 interposed therebetween. The fourth balanced transmission line 26B (the conductor layer 561) is opposed to the second line portion 24B (the conductor layer 541) with the dielectric layers 54 and 55 interposed therebetween.

Now, a first region R1 and a second region R2 in the stack 50 will be defined as shown in FIG. 5. The first region R1 is a region in the stack 50 extending from the dielectric layer 64 to the dielectric layer 69. The second region R2 is a region in the stack 50 extending from the dielectric layer 51 to the dielectric layer 56. The first region R1 and the second region R2 are separate from each other in the stacking direction T. The first line portion 24A (the conductor layer 671), the first balanced transmission line 25A (the conductor layer 651), and the second balanced transmission line 26A (the conductor layer 691) are located in the first region R1. The second line portion 24B (the conductor layer 541), the third balanced transmission line 25B (the conductor layer 521), and the fourth balanced transmission line 26B (the conductor layer 561) are located in the second region R2.

The inductor 31 of the first filter 30 is constructed as follows. The conductor layers 532, 542, 552 and 562 shown in FIG. 6C to FIG. 7C are connected in series by the through holes 53T10, 54T10 and 55T10. The inductor 31 is formed by these conductor layers 532, 542, 552 and 562 and the through holes 53T10, 54T10 and 55T10. The intersection point of the through hole 67T9 and the branch part of the conductor layer 671 shown FIG. 11B corresponds to the connection point 4 shown in FIG. 2. The conductor layer 532 is connected to the aforementioned intersection point via the through holes 53T9 to 66T9.

The inductor 32 of the first filter 30 is constructed as follows. The conductor layers 592, 612 and 632 shown in FIG. 8C, FIG. 9B and FIG. 10A are connected in series by the through holes 59T11, 60T11, 61T11 and 62T12. The inductor 32 is formed by these conductor layers 592, 612 and 632 and the through holes 59T11, 60T11, 61T11 and 62T12. The conductor layer 632 is connected to the conductor layer 562, which forms the inductor 31, via the through holes 63T11 to 68T11, the conductor layer 694, the through hole 68T10, the conductor layer 684 and the through holes 56T10 to 67T10. The conductor layer 592 is connected to the first signal terminal 11 via the through holes 59T1 to 75T1, the conductor layer 762 and the through holes 76T1 and 77T1.

The capacitor 33 of the first filter 30 is formed by the conductor layers 692 and 702 shown in FIG. 12A and FIG. 12B, and the dielectric layer 69. The bottom surface of the conductor layer 692 is opposed to the top surface of the conductor layer 702 with the dielectric layer 69 interposed therebetween. The conductor layer 692 is connected to the conductor layer 592, which forms the inductor 32, via the through holes 59T1 to 68T1. The conductor layer 702 is connected to the conductor layer 632, which forms the inductor 32, via the through hole 69T10, the conductor layer 694 and the through holes 63T11 to 68T11.

The capacitor 34 of the first filter 30 is formed by the conductor layers 702, 712, 722, 732, 742 and 752 shown in FIG. 12B to FIG. 14A, and the dielectric layers 70, 71, 72, 73 and 74. The top surface of the conductor layer 712 is opposed to the bottom surface of the conductor layer 702 with the dielectric layer 70 interposed therebetween. The bottom surface of the conductor layer 712 is opposed to the top surface of the conductor layer 722 with the dielectric layer 71 interposed therebetween. The top surface of the conductor layer 732 is opposed to the bottom surface of the conductor layer 722 with the dielectric layer 72 interposed therebetween. The bottom surface of the conductor layer 732 is opposed to the top surface of the conductor layer 742 with the dielectric layer 73 interposed therebetween. The top surface of the conductor layer 752 is opposed to the bottom surface of the conductor layer 742 with the dielectric layer 74 interposed therebetween.

The conductor layer 694 shown in FIG. 12A corresponds to the connection point between the inductors 31 and 32. The conductor layers 702, 722 and 742 are connected to the conductor layer 694 via the through holes 69T10 and 70T10, the conductor layer 714 and the through holes 71T10 to 73T10. The conductor layers 712, 732 and 752 are connected to the ground terminal 14 via the through holes 71T4 to 75T4, the conductor layer 766 and the through holes 76T4 and 77T4.

The capacitor 35 of the first filter 30 is formed by the conductor layers 752 and 762 shown in FIG. 14A and FIG. 14B, and the dielectric layer 75. The bottom surface of the conductor layer 752 is opposed to the top surface of the conductor layer 762 with the dielectric layer 75 interposed therebetween. The conductor layer 762 is connected to the first signal terminal 11 via the through holes 76T1 and 77T1. The conductor layer 752 is connected to the ground terminal 14 via the through hole 75T4, the conductor layer 766 and the through holes 76T4 and 77T4.

The capacitor 41 of the second filter 40 is formed by the conductor layers 683, 693, 703 and 713 shown in FIG. 11C to FIG. 12C, and the dielectric layers 68, 69 and 70. The top surface of the conductor layer 693 is opposed to the bottom surface of the conductor layer 683 with the dielectric layer 68 interposed therebetween. The bottom surface of the conductor layer 693 is opposed to the top surface of the conductor layer 703 with the dielectric layer 69 interposed therebetween. The top surface of the conductor layer 713 is opposed to the bottom surface of the conductor layer 703 with the dielectric layer 70 interposed therebetween. The conductor layers 683 and 703 are connected to the connection point 4, i.e., the intersection point of the through hole 67T9 and the branch part of the conductor layer 671 shown in FIG. 11B, via the through holes 67T9 to 69T9.

The capacitor 42 of the second filter 40 is formed by the conductor layers 713, 723, 733 and 743 shown in FIG. 12C to FIG. 13C, and the dielectric layers 71, 72 and 73. The top surface of the conductor layer 723 is opposed to the bottom surface of the conductor layer 713 with the dielectric layer 71 interposed therebetween. The bottom surface of the conductor layer 723 is opposed to the top surface of the conductor layer 733 with the dielectric layer 72 interposed therebetween. The top surface of the conductor layer 743 is opposed to the bottom surface of the conductor layer 733 with the dielectric layer 73 interposed therebetween. The capacitors 41 and 42 are connected to each other by the conductor layer 713.

The capacitor 43 of the second filter 40 is formed by the conductor layers 743 and 753 shown in FIG. 13C and FIG. 14A, and the dielectric layer 74. A part of the bottom surface of the conductor layer 743 is opposed to the top surface of the conductor layer 753 with the dielectric layer 74 interposed therebetween. The capacitors 42 and 43 are connected to each other by the conductor layer 743. The conductor layer 753 is connected to the second signal terminal 12 via the through hole 75T2, the conductor layer 763 and the through holes 76T2 and 77T2.

The capacitor 44 of the second filter 40 is formed by the conductor layers 743 and 754 shown in FIG. 13C and FIG. 14A, and the dielectric layer 74. Another part of the bottom surface of the conductor layer 743 is opposed to the top surface of the conductor layer 754 with the dielectric layer 74 interposed therebetween. The capacitors 42, 43 and 44 are connected to each other by the conductor layer 743. The conductor layer 754 is connected to the connection point 4, i.e., the intersection point of the through hole 67T9 and the branch part of the conductor layer 671, via the through holes 68T9 to 74T9, the conductor layer 683 and the through hole 67T9.

The inductor 45 of the second filter 40 is constructed as follows. The conductor layers 533, 543, 553 and 563 shown in FIG. 6C to FIG. 7C are connected in series by the through holes 53T13, 54T13 and 55T13. The inductor 45 is formed by these conductor layers 533, 543, 553 and 563 and the through holes 53T13, 54T13 and 55T13. The conductor layer 563 is connected to the conductor layer 713, i.e., the connection point between the capacitors 41 and 42, via the through hole 56T13, the conductor layer 572 and the through holes 57T13 to 70T13. The conductor layer 533 is connected to the ground terminal 15 via the through holes 53T5 to 77T5.

The inductor 46 of the second filter 40 is constructed as follows. The conductor layers 613, 623 and 633 shown in FIG. 9B to FIG. 10A are connected in series by the through holes 61T12 and 62T12. The inductor 46 is formed by these conductor layers 613, 623 and 633 and the through holes 61T12 and 62T12. The conductor layer 613 is connected to the conductor layer 753, which forms the capacitor 43, via the through holes 61T2 to 74T2. The conductor layer 633 is connected to the conductor layer 743, which forms the capacitor 43, via the through holes 63T12 and 64T12, the conductor layer 652 and the through holes 65T12 to 73T12.

The capacitor 29 is formed by the conductor layers 741 and 751 shown in FIG. 13C and FIG. 14A, and the dielectric layer 74. The bottom surface of the conductor layer 741 is opposed to the top surface of the conductor layer 751 with the dielectric layer 74 interposed therebetween. The conductor layer 741 is connected to the second balanced terminal 13B via the through holes 74T3B and 75T3B, the conductor layer 765 and the through holes 76T3B and 77T3B. The conductor layer 751 is connected to the ground terminal 15 via the through holes 75T5 to 77T5.

The capacitor 49 is formed by the conductor layers 534, 544 and 554 shown in FIG. 6C to FIG. 7B, and the dielectric layers 53 and 54. The top surface of the conductor layer 544 is opposed to the bottom surface of the conductor layer 534 with the dielectric layer 53 interposed therebetween. The bottom surface of the conductor layer 544 is opposed to the top surface of the conductor layer 554 with the dielectric layer 54 interposed therebetween. The conductor layer 544 is connected to the conductor layer 541 which forms the second line portion 24B. The conductor layers 534 and 554 are connected to the connection point 4, i.e., the intersection point of the through hole 67T9 and the branch part of the conductor layer 671, via the through holes 53T9 to 66T9.

The operation of the balun 2 of the multilayer electronic component 1 according to the embodiment will now be described. The balun 2 is configured so that an unbalanced signal is received at/output from the unbalanced port 20, a first balanced element signal is received at/output from the first balanced port 23A, and a second balanced element signal is received at/output from the second balanced port 23B. The first balanced element signal and the second balanced element signal constitute a balanced signal. The balun 2 converts between balanced and unbalanced signals.

Next, the operation of the branching circuit 3 of the multilayer electronic component 1 according to the embodiment will be described. Signals output from the unbalanced port 20 of the balun 2 are supplied to the connection point 4 between the first filter 30 and the second filter 40. The first filter 30 selectively passes a first signal of a frequency within a first frequency band. The second filter 40 selectively passes a second signal of a frequency within a second frequency band higher than the first frequency band. Thus, the first signal supplied to the connection point 4 is output from the first signal terminal 11, and the second signal supplied to the connection point 4 is output from the second signal terminal 12. In this way, the branching circuit 3 separates the first signal of a frequency within the first frequency band and the second signal of a frequency within the second frequency band from each other. Both the first signal received at the first signal terminal 11 and the second signal received at the second signal terminal 12 pass through the connection point 4 and are supplied to the unbalanced port 20 of the balun 2.

Now, the effects of the multilayer electronic component 1 according to the embodiment will be described. In the multilayer electronic component 1 according to the embodiment, the balun 2 includes the first and second balanced transmission lines 25A and 26A configured to be electromagnetically coupled to the first line portion 24A of the unbalanced transmission line 24, and further includes the third and fourth balanced transmission lines 25B and 26B configured to be electromagnetically coupled to the second line portion 24B of the unbalanced transmission line 24. This allows the balun 2 to exhibit a good amplitude balance characteristic and a good phase balance characteristic over a wide frequency band.

Figure 16:
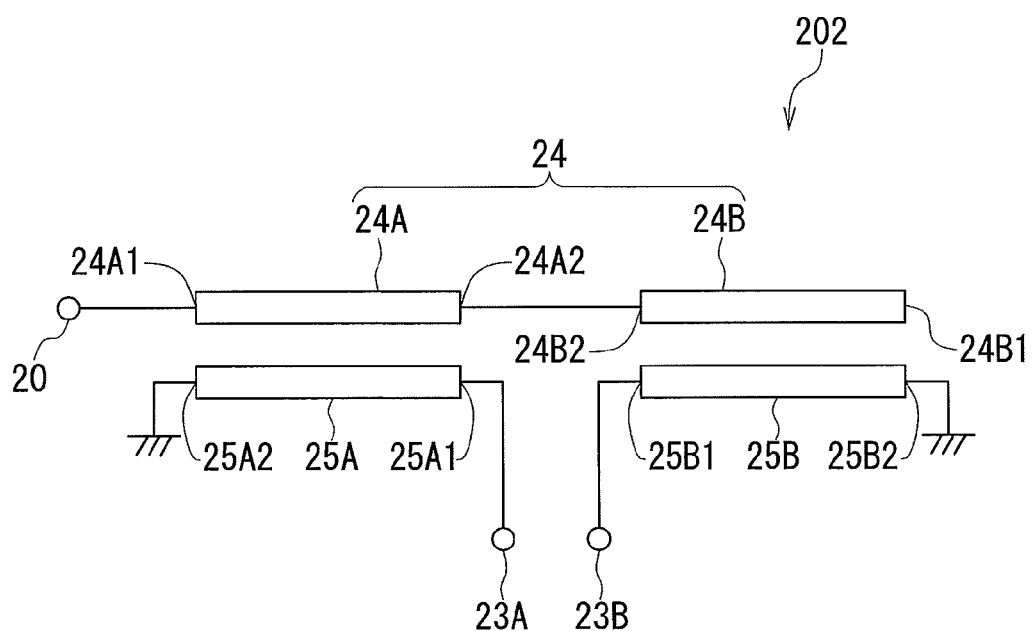
FIG. 16 is a circuit diagram illustrating the circuit configuration of a balun of a comparative example.

The following will describe the results of a simulation that was performed to determine the amplitude and phase balance characteristics of the balun 2 of the embodiment and a balan 202 of a comparative example. FIG. 16 is a circuit diagram illustrating the circuit configuration of the balun 202 of the comparative example. As shown in FIG. 16, the balun 202 of the comparative example is configured by omitting the second balanced transmission line 26A and the fourth balanced transmission line 26B from the balun 2 of the embodiment.

Now, amplitude and phase differences related to the characteristics of the baluns 2 and 202 are defined as follows. An amplitude difference is a difference in amplitude between the first balanced element signal output from the first balanced port 23A and the second balanced element signal output from the second balanced port 23B when an unbalanced signal is received at the unbalanced port 20. The amplitude difference is expressed in positive values when the amplitude of the first balanced element signal is greater than that of the second balanced element signal, and in negative values when the amplitude of the first balanced element signal is smaller than that of the second balanced element signal.

A phase difference is a difference in phase between the first balanced element signal output from the first balanced port 23A and the second balanced element signal output from the second balanced port 23B when an unbalanced signal is received at the unbalanced port 20. More specifically, the phase difference represents the magnitude of advancement in phase of the first balanced element signal relative to the second balanced element signal.

The amplitude balance characteristic is the frequency response of the amplitude difference. Assuming that the amplitude difference falls within the range of ±M [dB] in the service frequency band of the balun, M being a positive value, it can be said that the smaller the value of M, the better the amplitude balance characteristic. The value of M is preferably 1.5 or smaller, and more preferably 1.0 or smaller.

The phase balance characteristic is the frequency response of the phase difference. Assuming that the phase difference falls within the range of 180±P [deg] in the service frequency band of the balun, P being a positive value, it can be said that the smaller the value of P, the better the phase balance characteristic. The value of P is preferably 15 or smaller, and more preferably 6 or smaller.

Figure 17:
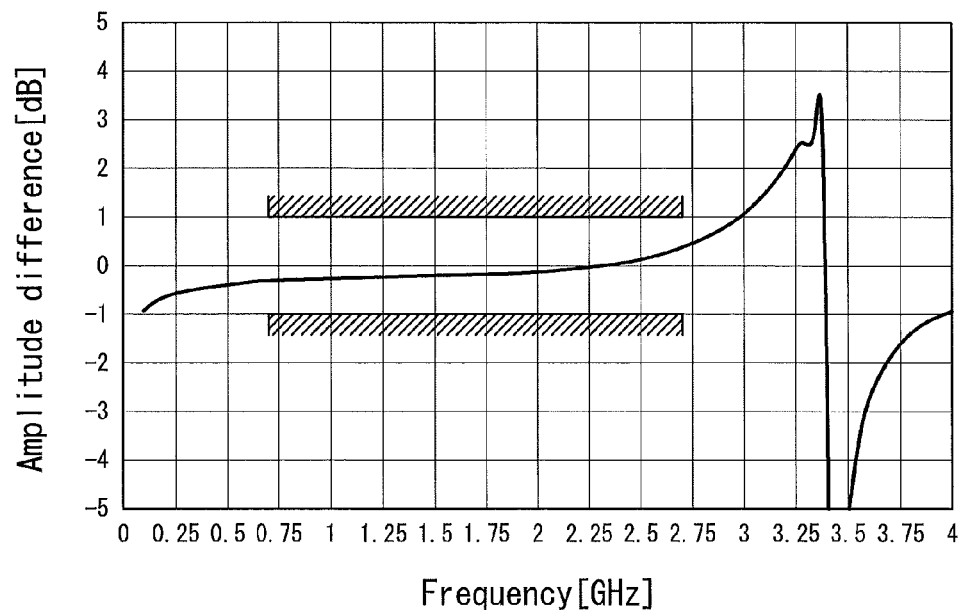
FIG. 17 is a characteristic diagram illustrating an example of the amplitude balance characteristic of the balun of the comparative example.
Figure 18:
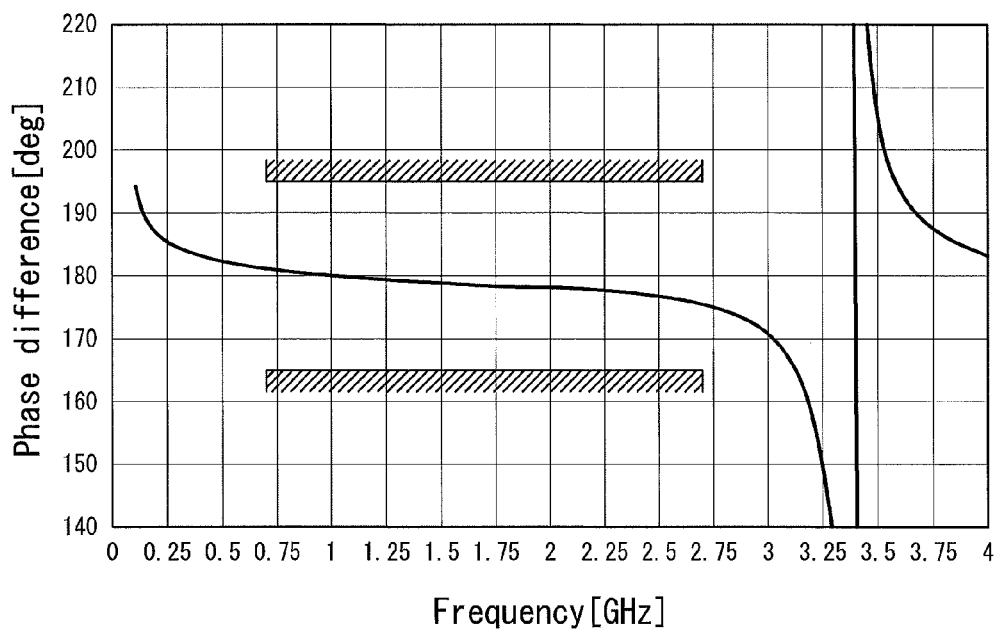
FIG. 18 is a characteristic diagram illustrating an example of the phase balance characteristic of the balun of the comparative example.
Figure 19:
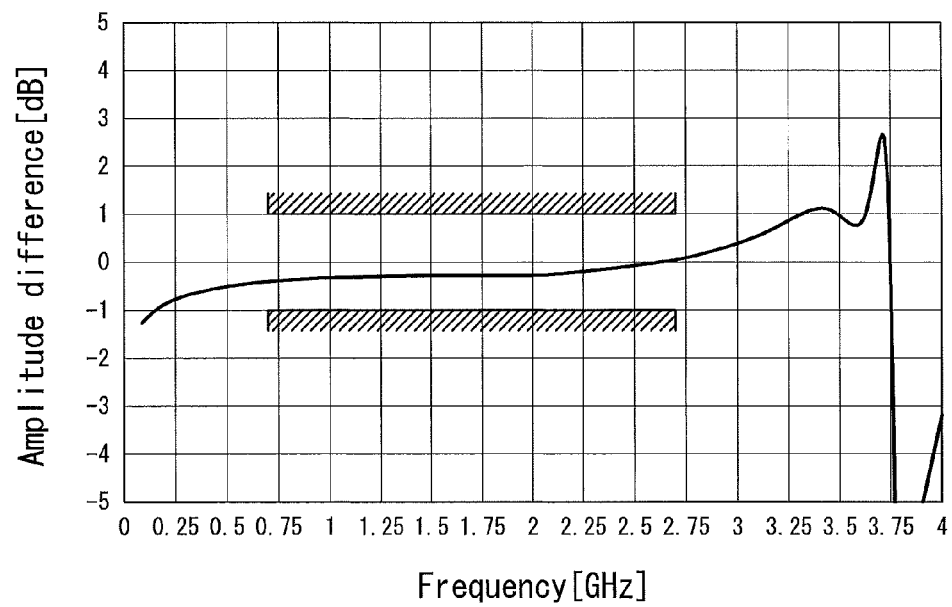
FIG. 19 is a characteristic diagram illustrating an example of the amplitude balance characteristic of the balun of the embodiment of the invention.
Figure 20:
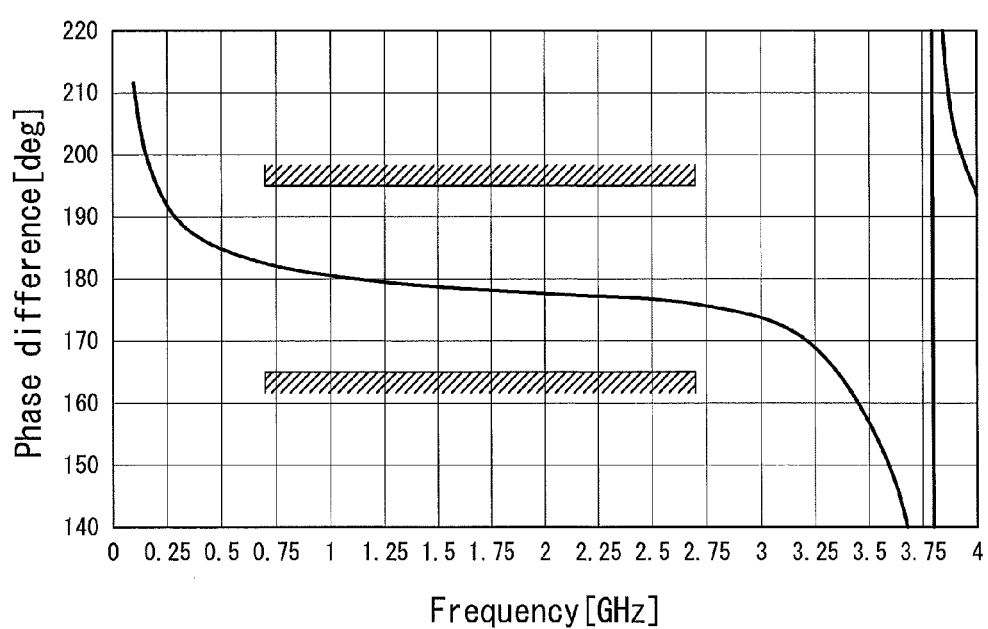
FIG. 20 is a characteristic diagram illustrating an example of the phase balance characteristic of the balun of the embodiment of the invention.

FIG. 17 is a characteristic diagram illustrating an example of the amplitude balance characteristic of the balun 202 of the comparative example. FIG. 18 is a characteristic diagram illustrating an example of the phase balance characteristic of the balun 202 of the comparative example. FIG. 19 is a characteristic diagram illustrating an example of the amplitude balance characteristic of the balun 2 of the embodiment. FIG. 20 is a characteristic diagram illustrating an example of the phase balance characteristic of the balun 2 of the embodiment. In FIG. 17 to FIG. 20 the horizontal axis represents frequency. In FIG. 17 and FIG. 19 the vertical axis represents the amplitude difference. In FIG. 18 and FIG. 20 the vertical axis represents the phase difference. The characteristics shown in FIG. 17 to FIG. 20 were determined by simulation. The simulation used models of the baluns 2 and 202 which were designed for a service frequency band of 0.7 to 2.7 GHz.

In both of the amplitude balance characteristic of the balun 202 of the comparative example shown in FIG. 17 and the amplitude balance characteristic of the balun 2 of the embodiment shown in FIG. 19, the amplitude difference in the service frequency band falls within the range of ±1 [dB]. Now, FIG. 17 and FIG. 19 will be compared for frequencies above 2.7 GHz. FIG. 17 shows that the amplitude difference falls outside the range of ±1 [dB] when the frequency is approximately 3 GHz or higher. In contrast, FIG. 19 shows that the amplitude difference falls within the range of ±1 [dB] at frequencies up to approximately 3.3 GHz. It can thus be said that the balun 2 of the embodiment exhibits a good amplitude balance characteristic up to a higher frequency than does the balun 202 of the comparative example.

In both of the phase balance characteristic of the balun 202 of the comparative example shown in FIG. 18 and the phase balance characteristic of the balun 2 of the embodiment shown in FIG. 20, the phase difference in the service frequency band falls within the range of 180±15 [deg]. Now, FIG. 18 and FIG. 20 will be compared for frequencies above 2.7 GHz. FIG. 18 shows that the phase difference falls outside the range of 180±15 [deg] when the frequency is approximately 3.1 GHz or higher. In contrast, FIG. 20 shows that the phase difference falls within the range of 180±15 [deg] at frequencies up to approximately 3.35 GHz. It can thus be said that the balun 2 of the embodiment exhibits a good phase balance characteristic up to a higher frequency than does the balun 202 of the comparative example.

The simulation results shown in FIG. 17 to FIG. 20 indicate that the balun 2 of the embodiment is capable of exhibiting a good amplitude balance characteristic and a good phase balance characteristic over a wider frequency band when compared with the balun 202 of the comparative example.

Now, we will discuss the reason why the balun 2 of the embodiment is capable of exhibiting a good amplitude balance characteristic and a good phase balance characteristic over a wider frequency band when compared with the balun 202 of the comparative example.

Hereinafter, a pair of quarter-wave lines electromagnetically coupled to each other will be referred to as two coupled lines. For the two coupled lines, it is known that an increase in capacitance between the two coupled quarter-wave lines (hereinafter, "line-to-line capacitance") leads to a decrease in odd mode impedance of the two coupled lines, and consequently to an increase in fractional bandwidth of the two coupled lines. JP 2004-056799A includes descriptions to that effect.

In the balun 202 of the comparative example, a pair of the first line portion 24A and the first balanced transmission line 25A and a pair of the second line portion 24B and the third balanced transmission line 25B each correspond to two coupled lines.

In the balun 2 of the embodiment, the first and second balanced transmission lines 25A and 26A are configured to be electromagnetically coupled to the first line portion 24A. If the first and second balanced transmission lines 25A and 26A connected in parallel are regarded as a single quarter-wave line, a pair of the first line portion 24A and the single quarter-wave line (the first and second balanced transmission lines 25A and 26A) correspond to two coupled lines. Similarly, a pair of the second line portion 24B and a single quarter-wave line constituted by the third and fourth balanced transmission lines 25B and 25B correspond to two coupled lines.

The line-to-line capacitance is greater in the balun 2 of the embodiment than in the balun 202 of the comparative example. It can thus be considered that in the balun 2 of the embodiment, the odd mode impedance of the two coupled lines is smaller and the fractional bandwidth of the two coupled lines is greater than in the balun 202 of the comparative example. This would be the reason why the balun 2 of the embodiment is capable of exhibiting a good amplitude balance characteristic and a good phase balance characteristic over a wider frequency band when compared with the balun 202 of the comparative example.

As described above, the multilayer electronic component 1 according to the embodiment provides the balun 2 which exhibits a good amplitude balance characteristic and a good phase balance characteristic over a wide frequency band.

In the embodiment, the balun 2 is formed using the stack 50. This allows for a reduction in the amount of space required for the balun 2, and consequently allows for miniaturization of the multilayer electronic component 1 including the balun 2. By virtue of the foregoing, this embodiment makes it possible to provide the multilayer electronic component 1 which is miniaturizable and includes the balun 2 exhibiting a good amplitude balance characteristic and a good phase balance characteristic over a wide frequency band.

In the embodiment, the first line portion 24A and the first and second balanced transmission lines 25A and 26A are at locations different from each other in the stacking direction T, the first line portion 24A being interposed between the first balanced transmission line 25A and the second balanced transmission line 26A. Such an arrangement makes it easier to increase the line-to-line capacitance when compared with the arrangement that the first line portion 24A and the first and second balanced transmission lines 25A and 26A are all in the same plane.

Similarly, the second line portion 24B and the third and fourth balanced transmission lines 25B and 26B are at locations different from each other in the stacking direction T, the second line portion 24B being interposed between the third balanced transmission line 25B and the fourth balanced transmission line 26B. Such an arrangement makes it easier to increase the line-to-line capacitance when compared with the arrangement that the second line portion 24B and the third and fourth balanced transmission lines 25B and 26B are all in the same plane.

This embodiment thus makes it easy to provide the balun 2 which exhibits a good amplitude balance characteristic and a good phase balance characteristic over a wide frequency band.

In the embodiment, the first and second line portions 24A and 25B and the first to fourth balanced transmission lines 25A, 26A, 25B and 26B each include a coil formed of a conductor wound in a spiral shape. This allows for a further reduction in the amount of space required for the balun 2. Each coil may be of at least one turn.

In the embodiment, the first line portion 24A and the first and second balanced transmission lines 25A and 26A are located in the first region R1 in the stack 50 extending from the dielectric layer 64 to the dielectric layer 69. The second line portion 24B and the third and fourth balanced transmission lines 25B and 26B are located in the second region R2 in the stack 50 extending from the dielectric layer 51 to the dielectric layer 56. The first region R1 and the second region R2 are separate from each other in the stacking direction T. By virtue of these features, it is possible to prevent the generation of unwanted coupling between the pair of the first line portion 24A and the first and second balanced transmission lines 25A, 26A and the pair of the second line portion 24B and the third and fourth balanced transmission lines 25B and 26B, and prevent the balun 2 from suffering characteristic degradation due to the unwanted coupling.

The multilayer electronic component 1 according to the embodiment includes the branching circuit 3 connected to the balun 2. The branching circuit 3 handles a plurality of frequency bands. The balun 2 of the embodiment exhibits a good amplitude balance characteristic and a good phase balance characteristic over a wide frequency band. This eliminates the need for preparing baluns on a per-frequency-band basis to suit the plurality of frequency bands handled by the branching circuit 3, and allows the use of the single balun 2 for the plurality of frequency bands handled by the branching circuit 3. This allows for miniaturization of the multilayer electronic component 1 including the balun 2 and the branching circuit 3.

It was confirmed by experiment that the balun 2 of the embodiment exhibited a good amplitude balance characteristic and a good phase balance characteristic over a wide frequency band even when the balun 2 was provided within the stack 50 together with the branching circuit 3. The experimental results will now be described. In the experiment, the multilayer electronic component 1 according to the embodiment and a multilayer electronic component of a comparative example were actually fabricated and their amplitude and phase balance characteristics were measured. The actually fabricated multilayer electronic component 1 according to the embodiment will be referred to as the multilayer electronic component 1 of Example. The multilayer electronic component of the comparative example was configured by omitting the second and fourth balanced transmission lines 26A and 26B of the balun 2 from the multilayer electronic component 1 of Example. In other words, the multilayer electronic component of the comparative example was provided with the balun 202 of the comparative example in place of the balun 2.

For the multilayer electronic component 1 of Example and the multilayer electronic component of the comparative example, the service frequency band for the baluns 2 and 202 was 0.7 to 2.7 GHz, the first frequency band or the pass band of the first filter 30 was 0.7 to 0.96 GHz, and the second frequency band or the pass band of the second filter 40 was 1.71 to 2.7 GHz.

The amplitude and phase balance characteristics were each measured for a low band and a high band. The low band is the 0.5- to 1.25-GHz band including the first frequency band. The high band is the 1.5- to 3-GHz band including the second frequency band.

To measure the low-band amplitude balance characteristic and the low-band phase balance characteristic, an unbalanced signal was input to the first signal terminal 11. To measure the high-band amplitude balance characteristic and the high-band phase balance characteristic, an unbalanced signal was input to the second signal terminal 12.

Figure 21:
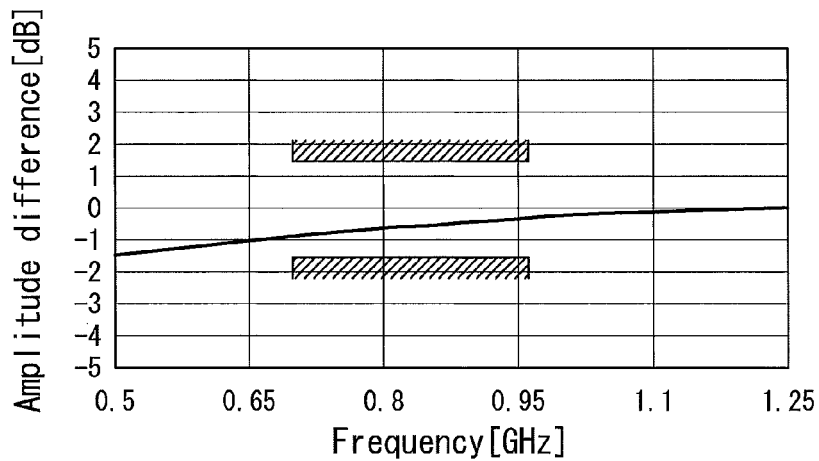
FIG. 21 is a characteristic diagram illustrating the low-band amplitude balance characteristic of a multilayer electronic component of a comparative example.
Figure 22:
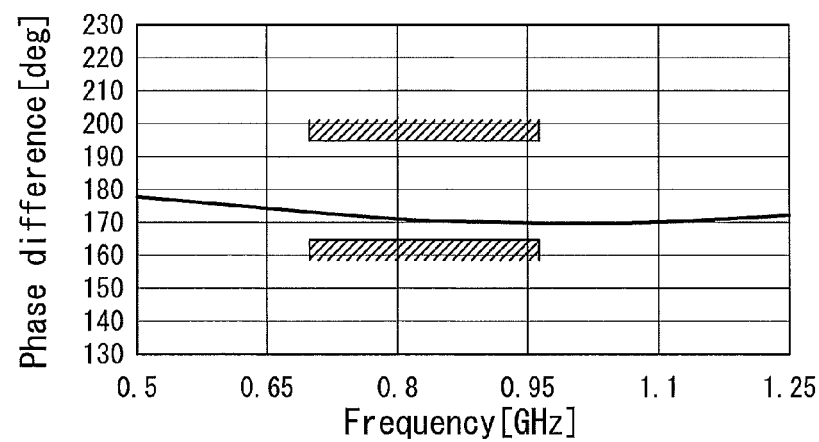
FIG. 22 is a characteristic diagram illustrating the low-band phase balance characteristic of the multilayer electronic component of the comparative example.
Figure 23:
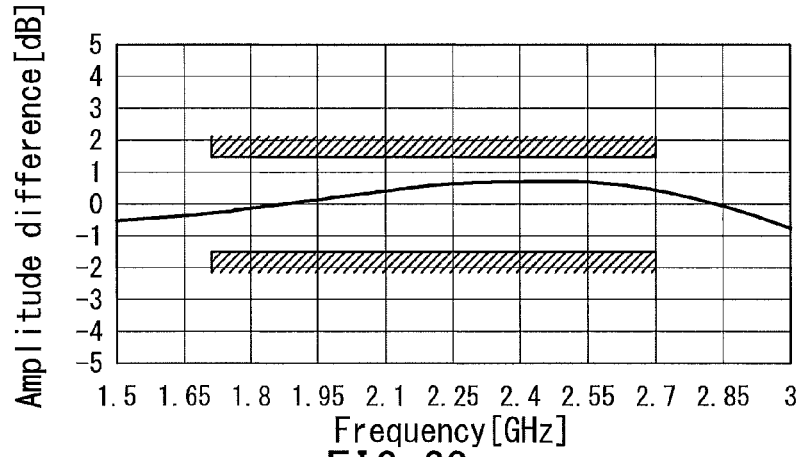
FIG. 23 is a characteristic diagram illustrating the high-band amplitude balance characteristic of the multilayer electronic component of the comparative example.
Figure 24:
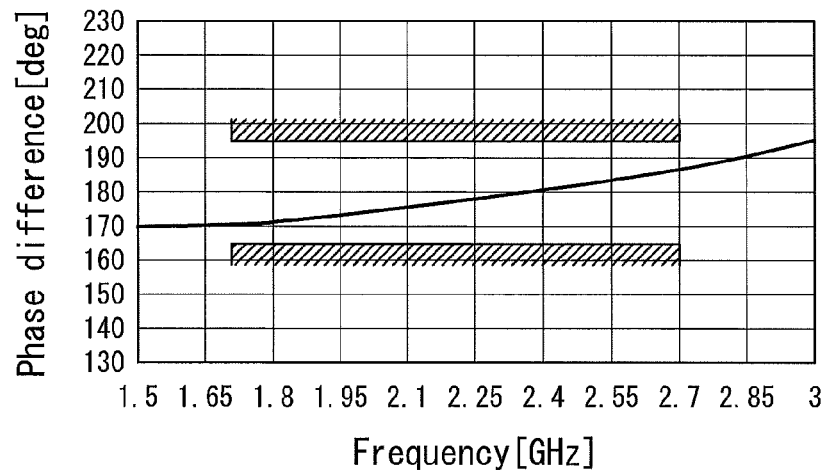
FIG. 24 is a characteristic diagram illustrating the high-band phase balance characteristic of the multilayer electronic component of the comparative example.

FIG. 21 is a characteristic diagram illustrating the low-band amplitude balance characteristic of the multilayer electronic component of the comparative example. FIG. 22 is a characteristic diagram illustrating the low-band phase balance characteristic of the multilayer electronic component of the comparative example. FIG. 23 is a characteristic diagram illustrating the high-band amplitude balance characteristic of the multilayer electronic component of the comparative example. FIG. 24 is a characteristic diagram illustrating the high-band phase balance characteristic of the multilayer electronic component of the comparative example.

Figure 25:
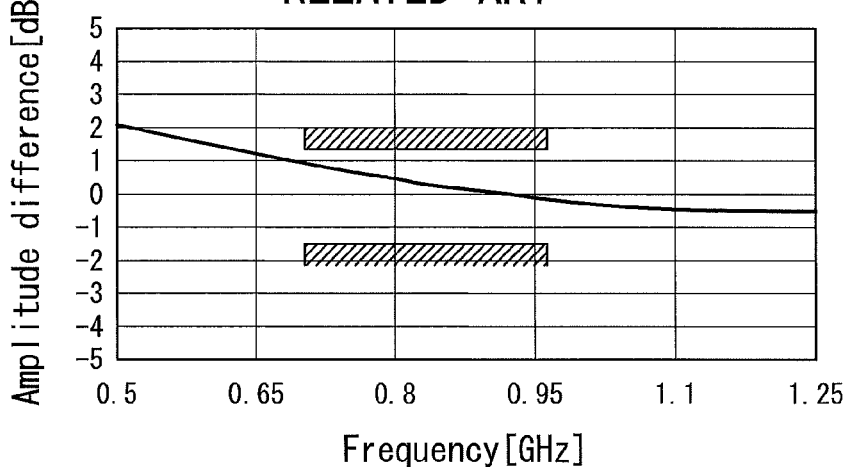
FIG. 25 is a characteristic diagram illustrating the low-band amplitude balance characteristic of a multilayer electronic component of Example.
Figure 26:
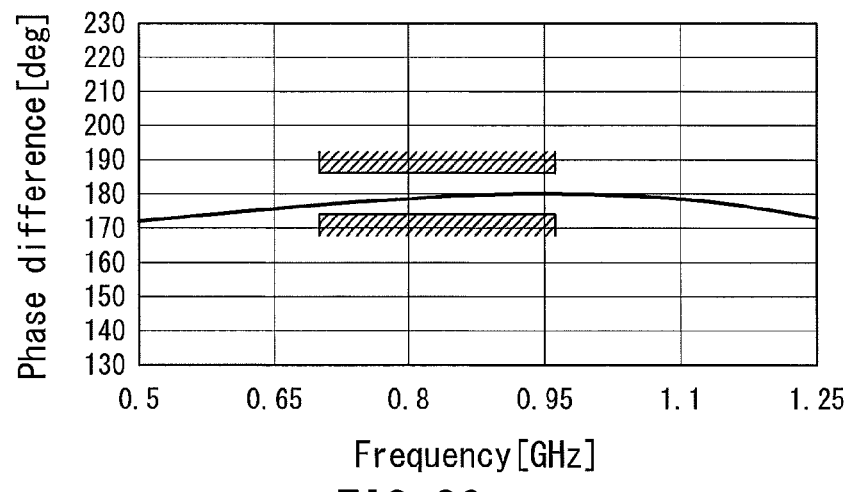
FIG. 26 is a characteristic diagram illustrating the low-band phase balance characteristic of the multilayer electronic component of Example.
Figure 27:
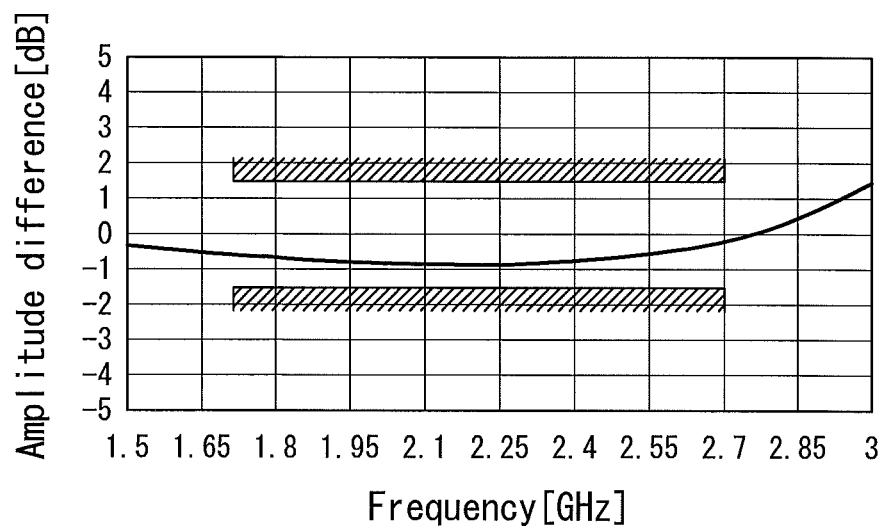
FIG. 27 is a characteristic diagram illustrating the high-band amplitude balance characteristic of the multilayer electronic component of Example.
Figure 28:
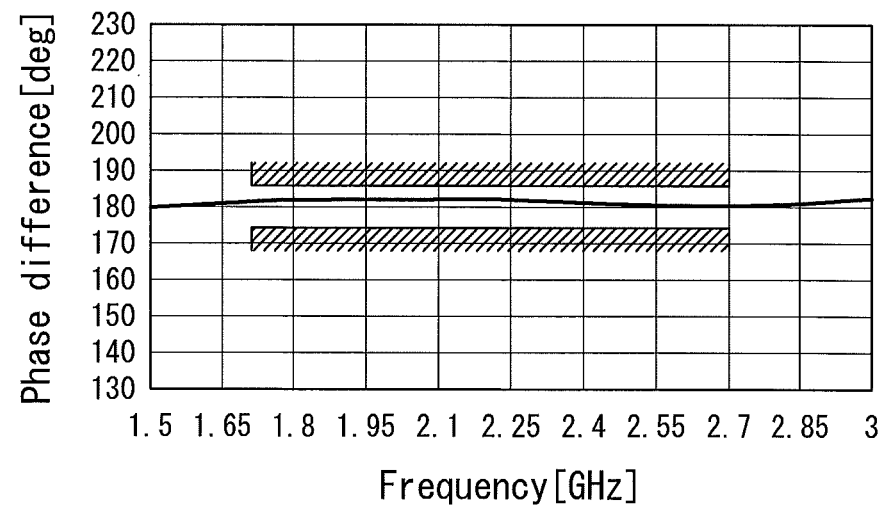
FIG. 28 is a characteristic diagram illustrating the high-band phase balance characteristic of the multilayer electronic component of Example.

FIG. 25 is a characteristic diagram illustrating the low-band amplitude balance characteristic of the multilayer electronic component 1 of Example. FIG. 26 is a characteristic diagram illustrating the low-band phase balance characteristic of the multilayer electronic component 1 of Example. FIG. 27 is a characteristic diagram illustrating the high-band amplitude balance characteristic of the multilayer electronic component 1 of Example. FIG. 28 is a characteristic diagram illustrating the high-band phase balance characteristic of the multilayer electronic component 1 of Example.

In FIG. 21 to FIG. 28, the horizontal axis represents frequency. In FIGS. 21, 23, 25 and 27, the vertical axis represents the amplitude difference. In FIGS. 22, 24, 26 and 28, the vertical axis represents the phase difference.

As shown in FIGS. 21, 23, 25 and 27, for both of the multilayer electronic component 1 of Example and the multilayer electronic component of the comparative example, the amplitude differences in the first and second frequency bands fall within the range of ±1.5 [dB].

As shown in FIGS. 22 and 24, for the multilayer electronic component of the comparative example, the phase differences in the first and second frequency bands fall within the range of 180±15 [deg], but not within the range of 180±6 [deg]. In contrast, as shown in FIGS. 26 and 28, for the multilayer electronic component 1 of Example, the phase differences in the first and second frequency bands fall within the range of 180±6 [deg].

Thus, the multilayer electronic component 1 of Example exhibits better phase balance characteristics in the first and second frequency bands when compared with the multilayer electronic component of the comparative example.

From the foregoing experimental results, it was confirmed that the balun 2 of the embodiment exhibited a good amplitude balance characteristic and a good phase balance characteristic over a wide frequency band even when the balun 2 was provided within the stack 50 together with the branching circuit 3.

The present invention is not limited to the foregoing embodiment, and various modifications may be made thereto. For example, in the present invention, at least one of the first and second line portions and first to fourth balanced transmission lines may be formed using two or more of the conductor layers included in the stack 50.

Further, the balun of the present invention may include, as the balanced transmission lines configured to be electromagnetically coupled to the first line portion of the unbalanced transmission line, not only the first and second balanced transmission lines but also additional one or more balanced transmission lines connected in parallel to the first and second balanced transmission lines.

Similarly, the balun of the present invention may include, as the balanced transmission lines configured to be electromagnetically coupled to the second line portion of the unbalanced transmission line, not only the third and fourth balanced transmission lines but also additional one or more balanced transmission lines connected in parallel to the third and fourth balanced transmission lines.

The balun of the present invention may include a plurality of unbalanced transmission lines connected in parallel. Each of the plurality of unbalanced transmission lines includes the first line portion and the second line portion. In this case, it suffices that at least one of the plurality of unbalanced transmission lines satisfies the requirements for the unbalanced transmission line defined in the appended claims.

The multilayer electronic component of the present invention includes at least the balun, and need not necessarily include any branching circuit. Where the multilayer electronic component of the present invention includes a branching circuit, the branching circuit may be one for separating three or more signals different in frequency from each other.

The multilayer electronic component of the present invention may include circuits other than the branching circuit, such as filters and matching circuits.

Obviously, many modifications and variations of the present invention are possible in the light of the above teachings. Thus, it is to be understood that, within the scope of the appended claims and equivalents thereof, the invention may be practiced in other than the foregoing most preferable embodiment.

What is claimed is:

1. A multilayer electronic component comprising:
a stack;
a balun formed using the stack; and
a branching circuit that is formed using the stack and connected to the balun, wherein
the stack includes a plurality of dielectric layers and a plurality of conductor layers stacked on each other,
the balun includes:
an unbalanced port;
a first balanced port;
a second balanced port;
an unbalanced transmission line including a first line portion and a second line portion connected in series;
a first balanced transmission line and a second balanced transmission line configured to be electromagnetically coupled to the first line portion; and
a third balanced transmission line and a fourth balanced transmission line configured to be electromagnetically coupled to the second line portion;
each of the first and second line portions and first to fourth balanced transmission lines has a first end and a second end opposite to each other,
the first end of the first line portion is connected to the unbalanced port,
the second end of the first line portion is connected to the second end of the second line portion,
the first end of the first balanced transmission line and the first end of the second balanced transmission line are connected to the first balanced port,
the first end of the third balanced transmission line and the first end of the fourth balanced transmission line are connected to the second balanced port,
each of the first and second line portions and first to fourth balanced transmission lines is formed using at least one of the plurality of conductor layers,
the branching circuit includes a first filter and a second filter connected to the unbalanced port,
the first filter selectively passes a first signal of a frequency within a first frequency band, and
the second filter selectively passes a second signal of a frequency within a second frequency band higher than the first frequency band.

2. The multilayer electronic component according to claim 1, wherein
the first line portion, the first balanced transmission line, and the second balanced transmission line are at locations different from each other in a direction in which the plurality of dielectric layers are stacked, the first line portion being interposed between the first balanced transmission line and the second balanced transmission line, and
the second line portion, the third balanced transmission line, and the fourth balanced transmission line are at locations different from each other in the direction in which the plurality of dielectric layers are stacked, the second line portion being interposed between the third balanced transmission line and the fourth balanced transmission line.

3. The multilayer electronic component according to claim 2, wherein each of the first and second line portions and first to fourth balanced transmission lines includes a coil.

4. The multilayer electronic component according to claim 1, wherein
the first line portion, the first balanced transmission line, and the second balanced transmission line are located in a first region in the stack,
the second line portion, the third balanced transmission line, and the fourth balanced transmission line are located in a second region in the stack, and
the first region and the second region are separate from each other in a direction in which the plurality of dielectric layers are stacked.

* * * * *